(12) United States Patent
Lee et al.

(10) Patent No.: US 12,520,640 B2
(45) Date of Patent: Jan. 6, 2026

(54) DISPLAY DEVICE

(71) Applicant: Samsung Display Co., LTD., Yongin-si (KR)

(72) Inventors: Hyun Wook Lee, Yongin-si (KR); No Kyung Park, Yongin-si (KR); Ki Nyeng Kang, Yongin-si (KR); Sung Won Jo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 1232 days.

(21) Appl. No.: 17/357,128

(22) Filed: Jun. 24, 2021

(65) Prior Publication Data

US 2022/0149255 A1 May 12, 2022

(30) Foreign Application Priority Data

Nov. 10, 2020 (KR) .................. 10-2020-0149657

(51) Int. Cl.
*H10H 20/857* (2025.01)
*G09G 3/32* (2016.01)
(Continued)

(52) U.S. Cl.
CPC ............ *H10H 20/857* (2025.01); *G09G 3/32* (2013.01); *H10H 20/8312* (2025.01); *H10H 20/84* (2025.01); *H10H 29/142* (2025.01)

(58) Field of Classification Search
None
See application file for complete search history.

(56) References Cited

U.S. PATENT DOCUMENTS 8,216,440 B2 7/2012 Shibata et al.
10,338,712 B2 * 7/2019 Bok ...................... H01L 25/167
(Continued)

FOREIGN PATENT DOCUMENTS

JP 2008-260073 10/2008
KR 10-1628345 6/2016
(Continued)

OTHER PUBLICATIONS

Lee et al (KR 2020027136A), Light Emitting Device and Display Device Including the same, Mar. 12, 2020 (Year: 2020).*

(Continued)

*Primary Examiner* — Alexander G Ghyka
(74) *Attorney, Agent, or Firm* — Womble Bond Dickinson (US) LLP

(57) ABSTRACT

A display device includes a base layer, a first pixel electrode disposed in a first direction on the base layer and to which a first driving voltage is applied, a second pixel electrode disposed in the first direction on the base layer and to which a second driving voltage is applied, a first light-emitting element and a second light-emitting element electrically connected to the first pixel electrode and the second pixel electrode, a connection electrode electrically connecting the first pixel electrode and the first light-emitting element, and electrically connecting the second light-emitting element and the second pixel electrode, and a bank overlapping at least a portion of the first pixel electrode and at least a portion of the second pixel electrode and surrounding a light-emitting area in which the first light-emitting element and the second light-emitting element are disposed. A portion of the connection electrode overlaps the bank.

16 Claims, 11 Drawing Sheets

(51) Int. Cl.
    *H10H 20/831*     (2025.01)
    *H10H 20/84*     (2025.01)
    *H10H 29/14*     (2025.01)

(56) References Cited

U.S. PATENT DOCUMENTS

| | | | |
|---|---|---|---|
| 10,818,647 | B2 | 10/2020 | Kim et al. |
| 2004/0135173 | A1* | 7/2004 | Choi ............... H01L 27/124 |
| | | | 257/E27.111 |
| 2008/0239219 | A1* | 10/2008 | Nagano ............ G02F 1/133555 |
| | | | 349/114 |
| 2014/0008654 | A1* | 1/2014 | Lin ................. H10D 1/692 |
| | | | 438/34 |
| 2018/0301519 | A1* | 10/2018 | Ma ................. H10K 50/816 |
| 2021/0217739 | A1 | 7/2021 | Lee et al. |
| 2022/0352268 | A1* | 11/2022 | Seo ................ H10K 71/00 |

FOREIGN PATENT DOCUMENTS

| | | |
|---|---|---|
| KR | 10-2018-0007025 | 1/2018 |
| KR | 10-2019-0124359 | 11/2019 |
| KR | 10-2020-0027136 | 3/2020 |
| KR | 10-2020-0070493 | 6/2020 |
| KR | 10-2020-0105598 | 9/2020 |

OTHER PUBLICATIONS

International Search Report corresponding to International Application No. PCT/KR2021/012066 dated Dec. 16, 2021.

* cited by examiner

DISPLAY DEVICE

CROSS-REFERENCE TO RELATED APPLICATION(S)

This application claims priority to and benefits of Korean Patent Application No. 10-2020-0149657 under 35 U.S.C. § 119, filed in the Korean Intellectual Property Office on Nov. 10, 2020, the entire contents of which are incorporated herein by reference.

BACKGROUND

1. Technical Field

The disclosure relates to a display device.

2. Description of the Related Art

With an increasing interest in information displays and an increasing demand for portable information media, the demand and commercialization of display devices have been focused on.

SUMMARY

An aspect of the disclosure is to provide a display device capable of minimizing short-circuit defects even if a residue of an electrode occurs on a bank.

A display device according to an embodiment of the disclosure may include a base layer, a first pixel electrode disposed in a first direction on the base layer and to which a first driving voltage is applied, a second pixel electrode disposed in the first direction on the base layer and to which a second driving voltage is applied, a first light-emitting element electrically connected to the first pixel electrode and the second pixel electrode, a second light-emitting element electrically connected to the first pixel electrode and the second pixel electrode, a connection electrode electrically connecting the first pixel electrode and the first light-emitting element, and electrically connecting the second light-emitting element and the second pixel electrode, and a bank overlapping at least a portion of the first pixel electrode and at least a portion of the second pixel electrode, the bank surrounding a light-emitting area in which the first light-emitting element and the second light-emitting element disposed, wherein a portion of the connection electrode the bank.

At least a portion of the first pixel electrode and at least a portion of the second pixel electrode may overlap the bank disposed at a side of the light-emitting area in a second direction perpendicular to the first direction in a plan view.

The first pixel electrode and the second pixel electrode may be spaced apart from each other in the second direction in a portion overlapping the bank.

The first pixel electrode and the second pixel electrode may be disposed apart from each other by at least 7 μm in the portion overlapping the bank.

The connection electrode may include a first vertical portion extending in the first direction, and a second vertical portion extending in the first direction, and a horizontal portion extending in the second direction, and the horizontal portion may overlap the bank disposed at another side of the light-emitting area in the second direction in a plan view.

A first end of the first light-emitting element may be electrically connected to the first vertical portion of the connection electrode, and a second end of the first light-emitting element may be electrically connected to the first pixel electrode.

A first end of the second light-emitting element may be electrically connected to the second pixel electrode, and a second end of the second light-emitting element may be electrically connected to the second vertical portion of the connection electrode.

An end of the first vertical portion and an end of the second vertical portion may be spaced apart from the bank in the light-emitting area.

The end of the first vertical portion and the end of the second vertical portion may be spaced apart from the bank by at least 3 μm.

An end of the first pixel electrode and an end of the second pixel electrode may be spaced apart from the bank in the light-emitting area.

The end of the first pixel electrode and the end of the second pixel electrode may be spaced apart from the bank by at least 3 μm.

A display device according to an embodiment of the disclosure may include a base layer, a first pixel electrode disposed in a first direction on the base layer and to which a first driving voltage is applied, a second pixel electrode disposed in the first direction on the base layer and to which a second driving voltage is applied, a light-emitting element electrically connected to the first pixel electrode and the second pixel electrode, and a bank overlapping at least a portion of the first pixel electrode and at least a portion of the second pixel electrode, the bank surrounding a light-emitting area in which the light-emitting element disposed, wherein at least a portion of the first pixel electrode the bank disposed at a side of the light-emitting area in a second direction perpendicular to the first direction in a plan view, and at least a portion of the second pixel electrode the bank disposed at another side of the light-emitting area in the second direction in a plan view.

The second pixel electrode may include a first sub-pixel electrode and a second sub-pixel electrode, and the first sub-pixel electrode and the second sub-pixel electrode of the second pixel electrode may be spaced apart from each other in the second direction in a portion overlapping the bank.

A first end of the light-emitting element may be electrically connected to the second pixel electrode, and a second end of the light-emitting element may be electrically connected to the first pixel electrode.

An end of the first pixel electrode may be spaced by at least 3 μm apart from the bank disposed at the another side of the light-emitting area in the light-emitting area.

An end of the second pixel electrode may be spaced by at least 3 μm apart from the bank disposed at the side of the light-emitting area in the light-emitting area.

A display device according to an embodiment of the disclosure may include a base layer, a pixel circuit layer on the base layer, a first alignment electrode and a second alignment electrode that are disposed on the pixel circuit layer, a first insulating layer covering the first alignment electrode and the second alignment electrode, a bank disposed on the first insulating layer, a first light-emitting element and a second light-emitting element that are disposed between the first alignment electrode and the second alignment electrode, and a connection electrode contacting a first end of the first light-emitting element and a second end of the second light-emitting element, wherein at least a portion of the connection electrode may be disposed on the bank.

The connection electrode may include a first vertical portion contacting the first end of the first light-emitting element, a second vertical portion contacting a second end of the second light-emitting element, and a horizontal portion disposed between the first vertical portion and the second vertical portion, wherein the horizontal portion may be disposed on the bank.

The display device may further include a first pixel electrode contacting a second end of the first light-emitting element, a second pixel electrode contacting a first end of the second light-emitting element, and an insulating layer disposed between the pixel circuit layer and the first pixel electrode and the second pixel electrode, wherein the pixel circuit layer may include a first transistor and a driving voltage line, the first pixel electrode may be electrically connected to the first transistor through a first contact hole of the insulating layer, and the second pixel electrode may be electrically connected to the driving voltage line through a second contact hole of the insulating layer.

At least a portion of the first pixel electrode and the second pixel electrode may be each disposed on the bank, and a side of the first pixel electrode and a side of the second pixel electrode may be disposed to be spaced apart from each other.

According to an embodiment, short-circuit defects may be minimized by arranging connection electrodes having a same potential to overlap a bank even if a residue of the electrode occurs on the bank.

Short-circuit defects can be minimized by arranging pixel electrodes to which different voltages may be applied to be spaced apart from each other even if the residue of the electrode occurs on the bank.

Effects according to embodiments are not limited by the contents above, and additional effects are included in the specification.

DETAILED DESCRIPTION OF THE EMBODIMENTS

Figure 1:
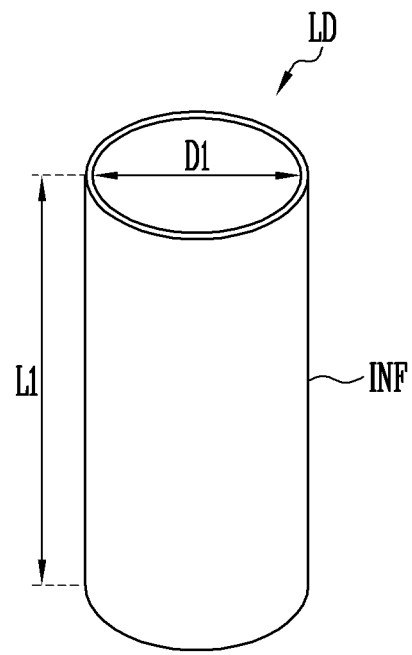
FIG. 1 is a perspective view schematically illustrating an example of a light-emitting element included in a display device according to an embodiment.

Hereinafter, embodiments of the disclosure will be described with reference to drawings wherein like reference characters refer to like elements.

It will be apparent to those skilled in the art that various modifications and variations can be made in the disclosure without departing from the spirit or scope of the disclosure, and specific embodiments are shown as examples in the drawings and explained in the detailed description. Thus, it is intended that the disclosure covers any and all modifications and variations.

The terms, "first", "second" and the like may be used for description of various constituent elements, but those terms are not meant to be limiting. The above terms are used only for distinguishing one constituent element from other constituent elements. For example, a first constituent element may be referred to as a second constituent element and similarly, the second constituent element may be referred to as the first constituent element. When explaining singular elements, unless explicitly described to the contrary, the same may be interpreted as including plural elements also, and vice versa.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." The phrase "at least one of" is intended to include the meaning of "at least one selected from the group of" for the purpose of its meaning and interpretation. For example, "at least one of A and B" may be understood to mean "A, B, or A and B."

In the specification and claims, the word "comprise", "has", "have", "includes", and the like are used to specify existence of a feature, a process, an operation, a constituent element, a part, a combination thereof, or the like, and it will be understood that the existence of one or more other features, processes, operations, constituent elements, parts, combinations thereof, or the like are not excluded. It will be understood that when an element such as a layer, film, region, or substrate is referred to as being "on" another element, it can be directly on the other element or intervening elements may also be present. In the specification, it will be understood that when an element such as a layer, film, region, or substrate is referred to as being disposed "on" another element, the disposed direction is not limited to an upper direction and the element may include disposition in a side direction, a lower direction, or the like. It will be understood that when an element such as a layer, film, region, or substrate is referred to as being "beneath" another element, it can be directly beneath the other element or intervening elements may also be present.

For convenience of description, a vertical direction on a plane may be indicated as a first direction DR1, and a horizontal direction on a plane may be indicated as a second direction DR2, and a thickness direction of the display device on a cross section may be indicated as a third direction DR3. The first to third directions DR1, DR2, and DR3 may represent directions indicated by the first to third directions DR1, DR2, and DR3, respectively.

The terms "overlap" or "overlapped" mean that a first object may be above or below or to a side of a second object, and vice versa. Additionally, the term "overlap" may include layer, stack, face or facing, extending over, extending under, covering, or partly covering or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

When an element is described as "not overlapping" or "to not overlap" another element, this may include that the elements are spaced apart from each other, offset from each other, or set aside from each other or any other suitable term as would be appreciated and understood by those of ordinary skill in the art.

"About", "approximately", and "substantially" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
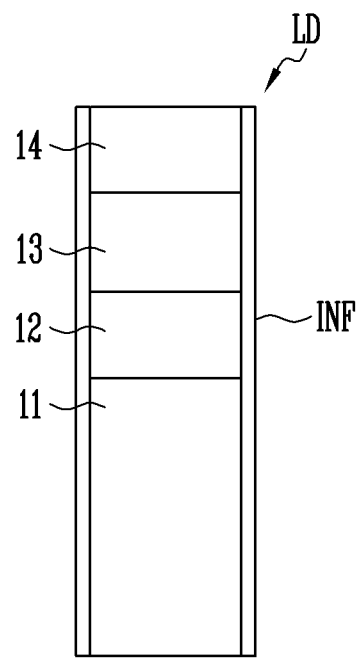
FIG. 2 is a schematic cross-sectional view of FIG. 1.

FIG. 1 is a perspective view schematically illustrating an example of a light-emitting element included in a display device according to an embodiment, and FIG. 2 is a schematic cross-sectional view of FIG. 1.

FIGS. 1 and 2 illustrate a columnar light-emitting element, but the type and/or shape of the light-emitting element according to an embodiment of the disclosure is not limited thereto.

Referring to FIGS. 1 and 2, a light-emitting element LD included in the display device according to an embodiment may include a first semiconductor layer 11, a second semiconductor layer 13, and an active layer 12 disposed between the first semiconductor layer 11 and the second semiconductor layer 13. For example, the light-emitting element LD may be formed of a laminate in which the first semiconductor layer 11, the active layer 12, and the second semiconductor layer 13 may be sequentially stacked on each other in a length L1 direction.

According to an embodiment, the light-emitting element LD may be provided in a rod shape extending in a direction, for example, a circular column shape. In case that the extending direction of the light-emitting element LD is the direction of the length L1, the light-emitting element LD may have an end and another end in the direction of the length L1.

According to an embodiment, one of the first semiconductor layer 11 and the second semiconductor layer 13 may be disposed at one end of the light-emitting element LD, and the other one of the first semiconductor layer 11 and the second semiconductor layer 13 may be disposed at the other end of the light-emitting element LD.

According to an embodiment, the light-emitting element LD may be a rod-shaped light-emitting diode manufactured in a rod shape. In this application, "rod-shaped" refers to rod-like shapes or bar-like shapes that may be long in a length direction (e.g., having an aspect ratio greater than 1), such as a circular column or a polygonal column, and a shape of a cross-section thereof is not particularly limited. For example, the length L1 of the light-emitting element LD may be larger than the diameter D1 (or the width of the cross section) thereof.

According to an embodiment, the light-emitting element LD may have a size as small as nanoscale to microscale. Each of the light-emitting elements LD may have the diameter D1 and/or the length L1 in the nanoscale to microscale range. For example, the length L1 of the light-emitting element LD may be about 100 nm to about 10 µm, the diameter D1 of the light-emitting element LD may be about 2 µm to about 6 µm, and the aspect ratio of the light-emitting element LD may be about 1.2 to about 100. However, the size of the light-emitting element LD in the disclosure is not limited thereto. For example, a size of the light emitting element LD may be variously changed according to design conditions of various devices using a light emitting device using at least one light emitting element LD as a light source, for example, a display device.

The first semiconductor layer 11 may include at least one N-type semiconductor layer. For example, the first semiconductor layer 11 may include at least one semiconductor material of InAlGaN, GaN, AlGaN, InGaN, AlN, and InN, and may include at least one n-type semiconductor layer doped with a first conductive dopant such as Si, Ge, Sn, and the like. However, the material constituting the first semiconductor layer 11 is not limited thereto, and various other materials may constitute the first semiconductor layer 11.

The active layer 12 may be disposed on the first semiconductor layer 11, and may be formed in a single or multiple quantum well structure. In an embodiment, a cladding layer (not shown) doped with a conductive dopant may be formed at an upper portion and/or lower portion of the active layer 12. For example, the cladding layer may be formed of an AlGaN layer or an InAlGaN layer. According to an embodiment, the material such as AlGaN, AlInGaN, and the like may be used to form the active layer 12, and various materials may constitute the active layer 12.

In case that a voltage of a threshold voltage or more is applied to opposite ends of the light-emitting element LD, the light-emitting element LD may emit light while electron-hole pairs may be coupled in the active layer 12. The light-emitting element LD may be used as a light source of various light-emitting elements including a pixel of the display device by controlling light emission of the light-emitting element LD using this principle.

The second semiconductor layer 13 may be disposed on the active layer 12, and may include a semiconductor layer of a different type from the first semiconductor layer 11. For example, the second semiconductor layer 13 may include at least one p-type semiconductor layer. For example, the second semiconductor layer 13 may include at least one semiconductor material of InAlGaN, GaN, AlGaN, InGaN, AlN, InN, and may include a p-type semiconductor layer doped with at least one second conductive dopant such as Mg, Zn, Ca, Sr, Ba, and the like. However, the material constituting the second semiconductor layer 13 is not limited thereto, and various other materials may constitute the second semiconductor layer 13.

Above, it is described that each of the first semiconductor layer 11 and the second semiconductor layer 13 may be composed of one layer, but the disclosure is not limited thereto. In an embodiment, according to the material of the active layer 12, each of the first semiconductor layer 11 and the second semiconductor layer 13 may further include at least one or more layers, for example, a cladding layer and/or tensile strain barrier reducing (TSBR) layer. The TSBR layer may be a strain mitigating layer that may be disposed between semiconductor layers having different lattice structures and serve as a buffer for reducing a difference in lattice constant. The TSBR layer may be composed of at least one p-type semiconductor layer such as p-GaInP, p-AlInP, p-AlGaInP, and the like, but the disclosure is not limited thereto. According to an embodiment, the light-emitting element LD may further include an insulating film INF provided on a surface thereof. The insulating film INF may be formed on a surface of the light-emitting element LD to overlap (e.g., cover) an outer circumferential surface of the active layer 12, and may further cover a portion of the first and second semiconductor layers 11 and 13. However, the insulating film INF may expose ends of the light-emitting element LD that may have different polarities. For example, the insulation film INF may expose without cover one end of each of the first semiconductor layer 11 and the second semiconductor layer 13, that may be disposed at ends of the light-emitting element LD in the direction of the length L1, for example, two bottom surfaces of the cylinder (e.g., the upper and lower surfaces of the light-emitting element LD).

In an embodiment, the light-emitting element LD may further include additional constituent elements in addition to the first semiconductor layer 11, the active layer 12, the second semiconductor layer 13, and the insulating film INF. For example, the light-emitting element LD may include at least one of a phosphor layer, an active layer, a semiconductor layer and an electrode, that may be disposed at an end of the first semiconductor layer 11, the active layer 12 and the second semiconductor layer 13.

The electrode 14 disposed at a side of an end of the light-emitting element LD may be an ohmic contact electrode or a Schottky contact electrode, but is not limited thereto. The electrode 14 may include metal or metal oxide, and for example, may be made of Cr, Ti, Al, Au, Ni, ITO, IZO, ITZO and oxides or alloys thereof alone or in combination. Further, according to an embodiment, the electrode 14 may be substantially transparent or translucent. Accordingly, light generated by the light-emitting element LD may transmit through the electrode 14 and be emitted to the outside of the light-emitting element LD.

According to an embodiment, the insulating film INF may or may not at least partially cover the outer circumferential surface of the electrode 14. For example, the insulating film INF may be selectively formed on the surface of the electrode 14. The insulating film INF may be formed to expose both ends of the light-emitting element LD having different polarities, and for example, may expose at least one area of the electrode 14. According to an embodiment, the insulating film INF may not be provided at the end of the light-emitting element LD.

In case that the insulating film INF is provided on the surface of the light-emitting element LD, in particular, a surface of the active layer 12, it may be possible to prevent the active layer 12 from being short-circuited with at least one electrode (e.g., at least one contact electrode of the contact electrodes connected to both ends of the light-emitting element LD) not shown, and the like. Accordingly, electrical stability of the light-emitting element LD can be secured.

By forming the insulating film INF on the surface of the light-emitting element LD, surface defects of the light-emitting element LD can be minimized, thereby improving life and efficiency. By forming the insulating film INF on each light-emitting element LD, an unwanted short circuit between the light-emitting elements LD can be prevented even in case that multiple light-emitting elements LD may be closely disposed with each other.

In an embodiment of the disclosure, the light-emitting element LD may be manufactured through a surface treatment process. For example, in case that multiple light-emitting elements LD may be mixed with a fluid solution (or a solvent) and supplied to each light-emitting area (e.g., a light-emitting area of each pixel), each light-emitting element LD may be surface-treated so that the light-emitting elements LD may be uniformly dispersed without non-uniform agglomeration in the solution.

The light-emitting element LD may be used in various types of devices that require a light source, including a display device. For example, at least one light-emitting element LD, for example, each of multiple light-emitting elements LD having a nanoscale or microscale size, may be disposed in each pixel area of a display device, and the light source (or light source unit) of each pixel can be configured of the light-emitting elements LD. However, in the disclosure, the field of application of the light-emitting element LD is not limited to a display device. For example, the light-emitting element LD may be used in other types of devices that require a light source, such as a lighting device.

Hereinafter, a display device according to an embodiment will be described with reference to FIGS. 3 and 4.

Figure 3:
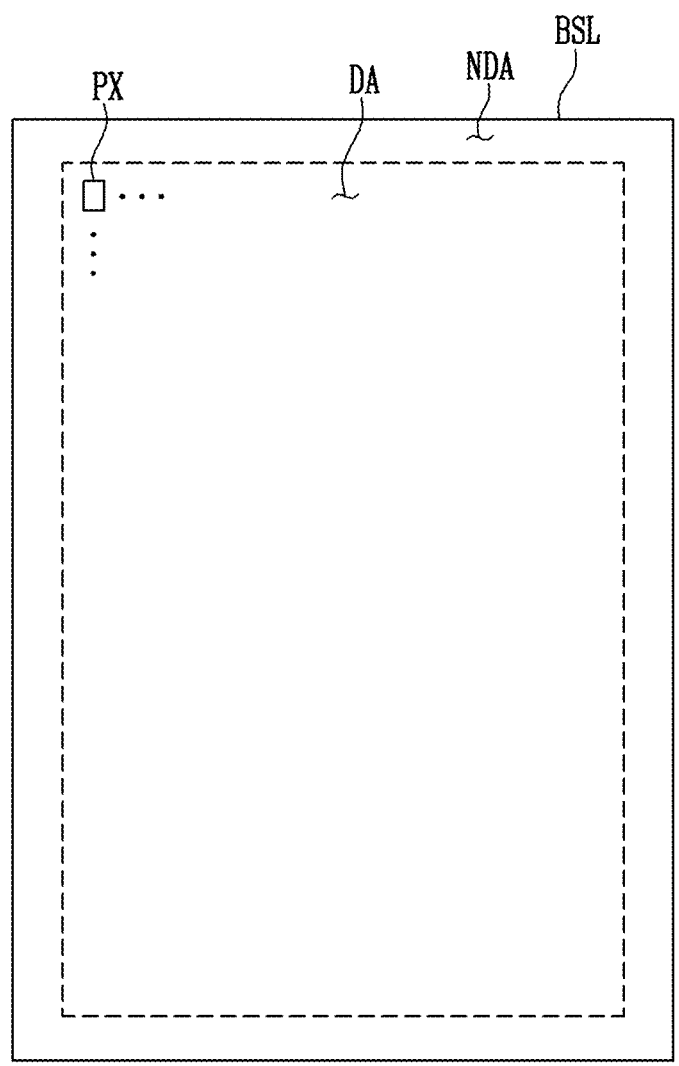
FIG. 3 is a plan view schematically illustrating an example of a display device according to an embodiment.
Figure 3:
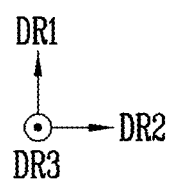
Figure 4:
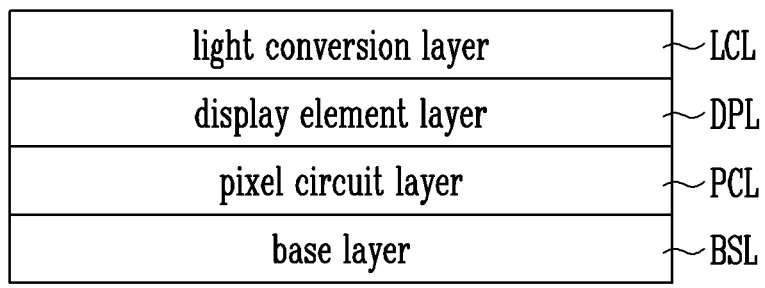
FIG. 4 is a cross-sectional view schematically illustrating an example of a display device according to an embodiment.
Figure 4:
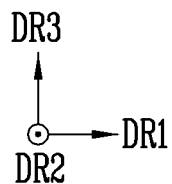

FIG. 3 is a plan view schematically illustrating an example of a display device according to an embodiment, and FIG. 4 is a cross-sectional view schematically illustrating an example of a display device according to an embodiment.

Referring to FIGS. 3 and 4, a display device is illustrated as an example of a device that can use the light-emitting element LD described in FIGS. 1 and 2 as a light source.

Referring to FIG. 3, the display device according to an embodiment may include a base layer BSL and pixels PX disposed on the base layer BSL.

Specifically, the display device and the base layer BSL for forming the same may include a display area DA for displaying an image and a non-display area NDA excluding the display area DA. The non-display area NDA may be a bezel area surrounding the display area DA.

The base layer BSL may constitute a base member of the display device. According to an embodiment, the base layer BSL may be a rigid or flexible substrate or film, and materials or physical properties thereof are not particularly limited. For example, the base layer BSL may be a hard substrate formed of glass or tempered glass, a flexible substrate (or thin film) formed of plastic or metallic material, or at least one insulating layer, and materials and properties thereof are not particularly limited.

The base layer BSL may be transparent, but is not limited thereto. For example, the base layer BSL may be a transparent, translucent, opaque, or reflective base member.

The display area DA may be disposed on a surface of the display device. For example, the display area DA may be disposed on a front surface of the display device, and may be additionally disposed on a side surface or a rear surface of the display device.

The non-display area NDA may be disposed around the display area DA to surround the display area DA. The non-display area NDA may selectively include wires, pads, and a driving circuit connected to the pixels PX of the display area DA.

In FIG. 3, only one pixel PX is illustrated, but multiple pixels PX may be disposed in the display area DA. For example, the pixels PX may be arranged in the display area DA in a distributive manner which may be, but not limited to, a matrix, stripe, or PenTile® arrangement structure.

Referring to FIG. 4, the display device may include the base layer BSL, a pixel circuit layer PCL, a display element layer DPL, and a light conversion layer LCL sequentially disposed in a third direction DR3 on a surface of the base layer BSL.

The base layer BSL may be a rigid or flexible substrate. For example, in case that the base layer BSL is a rigid substrate, the base layer BSL may be implemented as a glass substrate, a quartz substrate, a glass ceramic substrate, a crystalline glass substrate, or the like. On the other hand, in case that the base layer BSL is a flexible substrate, the base layer BSL may be implemented as a polymer organic material substrate including polyimide, polyamide, or the like, a plastic substrate, or the like.

The pixel circuit layer PCL may be disposed on the base layer BSL. The pixel circuit layer PCL may include circuit elements for constituting a pixel circuit of each pixel PX and various wires connected to the circuit elements. For example, the pixel circuit layer PCL may include at least one transistor, a storage capacitor, a gate line, a data line, a power line, or the like.

The display element layer DPL may be disposed on the pixel circuit layer PCL. The display element layer DPL may include a light-emitting element LD (refer to FIGS. 1 and 2) constituting a light source of each pixel PX. For example, the light-emitting element LD may be an organic light-emitting diode, an inorganic light-emitting diode, or a micro-sized inorganic light-emitting diode having a nanoscale to microscale size. However, in the disclosure, the type, structure, shape and/or size of the light-emitting element provided in each pixel is not particularly limited.

According to an embodiment, the display element layer DPL may be first disposed on the base layer BSL, and the pixel circuit layer PCL may be disposed on the display element layer DPL.

The light conversion layer LCL may be disposed on the display element layer DPL. The light conversion layer LCL may convert light emitted from the display element layer DPL, and include a color filter including a color filter material of a color, and color conversion particles (e.g., quantum dots) corresponding to the color, thereby converting light generated from the display element layer DPL. For example, the light conversion layer LCL can selectively transmit light of a specific wavelength band among light generated from the display element layer DPL, or can convert a wavelength band of light generated from the display element layer DPL.

In FIGS. 3 and 4, a configuration of the display device is schematically described on the assumption that the display device is a light-emitting display device, but the disclosure is not limited thereto. For example, a specific configuration may be variously changed according to the type of display device.

Hereinafter, a configuration of a pixel according to an embodiment will be described with reference to FIG. 5.

Figure 5:
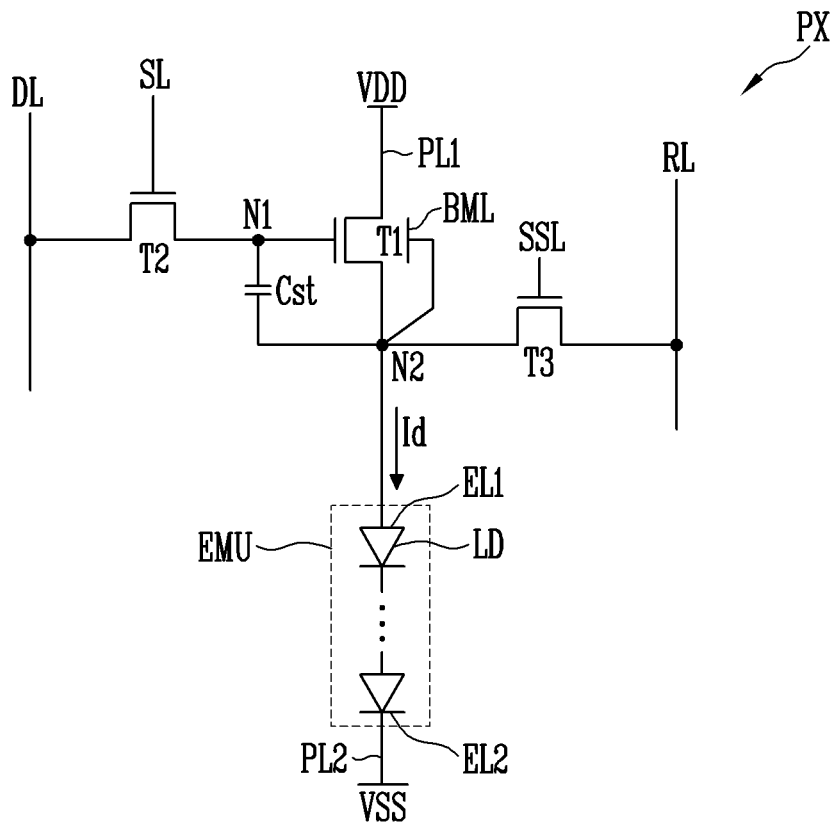
FIG. 5 is a circuit diagram schematically illustrating an electrical connection relationship between components included in a pixel of a display device according to an embodiment.

FIG. 5 is a circuit diagram schematically illustrating an electrical connection relationship between components that may be included in a pixel of a display device according to an embodiment.

Referring to FIG. 5, the pixel PX may include a first transistor T1, a second transistor T2, a third transistor T3, a storage capacitor Cst, and a light-emitting unit EMU.

A first electrode of the first transistor T1 (or a driving transistor) may be connected to the first power line PL1, and a second electrode thereof may be connected to a first pixel electrode EL1 (or a second node N2) of the light-emitting unit EMU. A gate electrode of the first transistor T1 may be connected to the first node N1. In an embodiment, the first electrode may be a drain electrode, and the second electrode may be a source electrode. The first transistor T1 may control an amount of current of a driving current Id flowing to the light-emitting unit EMU in response to a voltage of the first node N1.

In an embodiment, the first transistor T1 may selectively include a bottom metal layer BML. The gate electrode and the bottom metal layer BML of the first transistor T1 may overlap each other with an insulating layer therebetween.

In an embodiment in which the first transistor T1 includes the bottom metal layer BML, a back-biasing technology (or sync technology) in which the threshold voltage of the transistor T1 may be moved in a negative or positive direction by applying a back-biasing voltage to the bottom metal layer BML of the first transistor T1 in driving the pixel PX may be applied. For example, by applying a source-sink technology connecting the bottom metal layer BML to one electrode of the first transistor T1, for example, a source electrode, the threshold voltage of the first transistor T1 may be moved in a negative direction or a positive direction.

The first electrode of the second transistor T2 (or a switching transistor) may be connected to the data line DL, and the second electrode thereof may be connected to the first node N1 (or the gate electrode of the first transistor T1). A gate electrode of the second transistor T2 may be connected to a first scan line SL. In case that a first scan signal (e.g., a high level voltage) is supplied to the first scan line SL, the second transistor T2 may be turned on to transfer a data voltage from the data line DL to the first node N1.

A first electrode of the third transistor T3 may be connected to a sensing line RL, and a second electrode thereof may be connected to a second node N2 (or the second electrode of the first transistor T1). A gate electrode of the third transistor T3 may be connected to a second scan line SSL. The third transistor T3 may be turned on in case that a second scan signal (e.g., a high level voltage) may be supplied to the second scan line SSL during a sensing period, and thus can electrically connect the sensing line RL and the second node N2.

The storage capacitor Cst may be connected between the first node N1 and the second node N2. The storage capacitor Cst may charge a data voltage corresponding to the data signal supplied to the first node N1 during one frame. Accordingly, the storage capacitor Cst may store a voltage corresponding to a voltage difference between the first node N1 and the second node N2. For example, the storage capacitor Cst may store a voltage corresponding to a difference between the data voltage supplied to the gate electrode of the first transistor T1 and the initialization voltage supplied to the second electrode of the first transistor T1.

The light-emitting unit EMU may include light-emitting elements LD connected in series between a first power line PL1 to which a first driving voltage VDD may be applied and a second power line PL2 to which a second driving voltage VSS may be applied. In an embodiment, it may mean that n light-emitting elements LD connected in series between the first power line PL1 and the second power line PL2 may be connected through n serial stages. One serial stage may include multiple light-emitting elements LD connected in parallel in the same direction.

Specifically, the light-emitting unit EMU may include multiple light-emitting elements LD connected in series between the first pixel electrode EL1 connected to the second node N2 and the second pixel electrode EL2 connected to the second power line PL2. Here, the first pixel electrode EL1 may be an anode, and the second pixel electrode EL2 may be a cathode.

The light-emitting unit EMU may generate light of a luminance in response to a driving current Id supplied from the first transistor T1. For example, during one frame period, the first transistor T1 may supply the driving current Id corresponding to a grayscale value of the corresponding frame data to the light-emitting unit EMU. The driving current Id supplied to the light-emitting unit EMU may be divided and flowed through the light-emitting elements LD. Accordingly, while each light-emitting element LD emits light with a luminance corresponding to the current flowing therethrough, the light-emitting unit EMU may emit light having a luminance corresponding to the driving current Id.

A circuit structure of the pixel PX in the disclosure is not limited by FIG. 5. For example, the light-emitting element LD may be disposed between the first power line PL1 and the first electrode of the first transistor T1.

The transistors are shown as NMOS in FIG. 5, but the disclosure is not limited thereto. For example, at least one of the first to third transistors T1, T2, and T3 may be implemented as a PMOS.

Hereinafter, a detailed configuration of a display device according to an embodiment will be described with reference to FIGS. 6 to 10.

Figure 6:
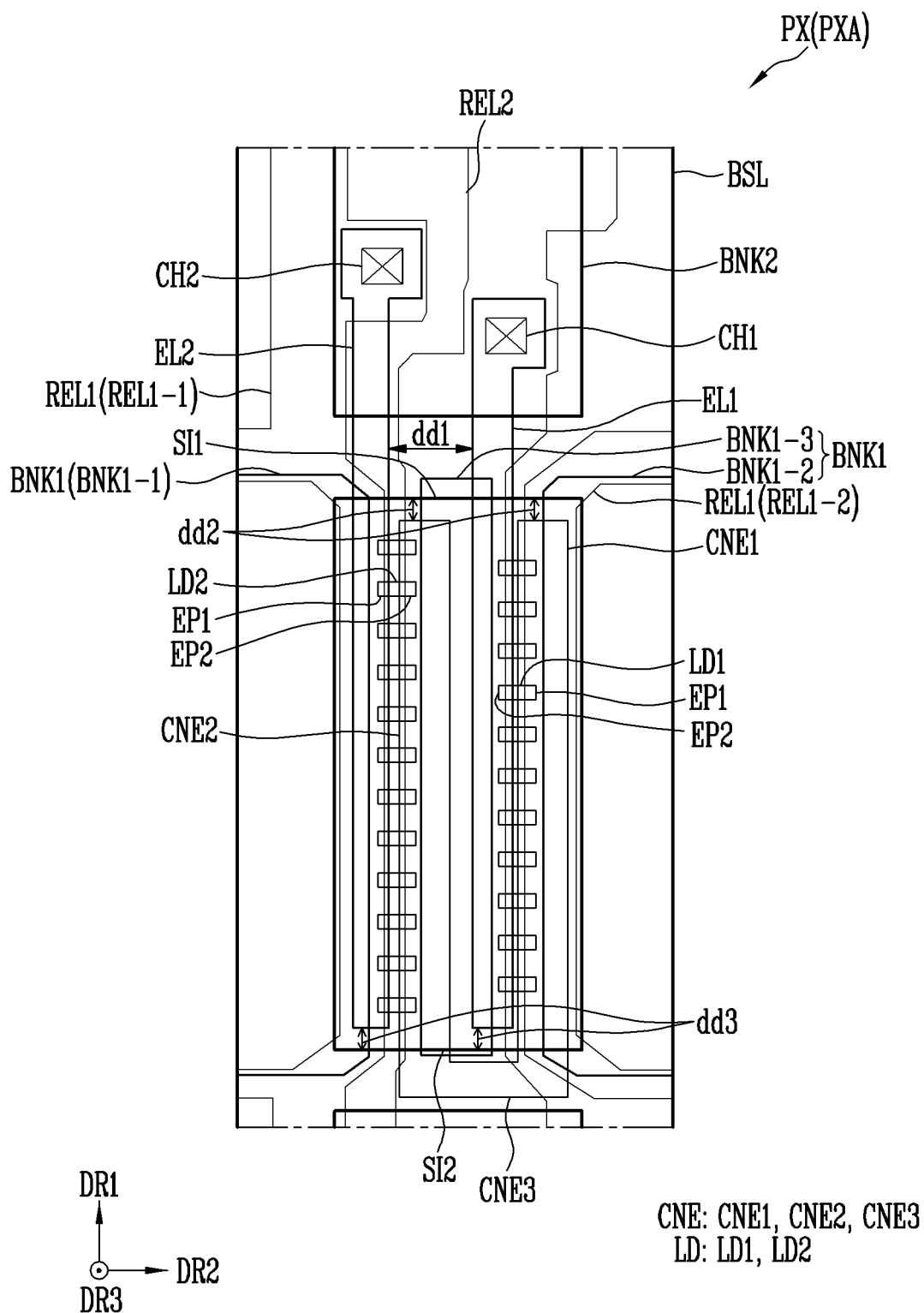
FIGS. 6 and 7 are plan views schematically illustrating an arrangement of a portion area of a pixel of a display device according to an embodiment.
Figure 7:
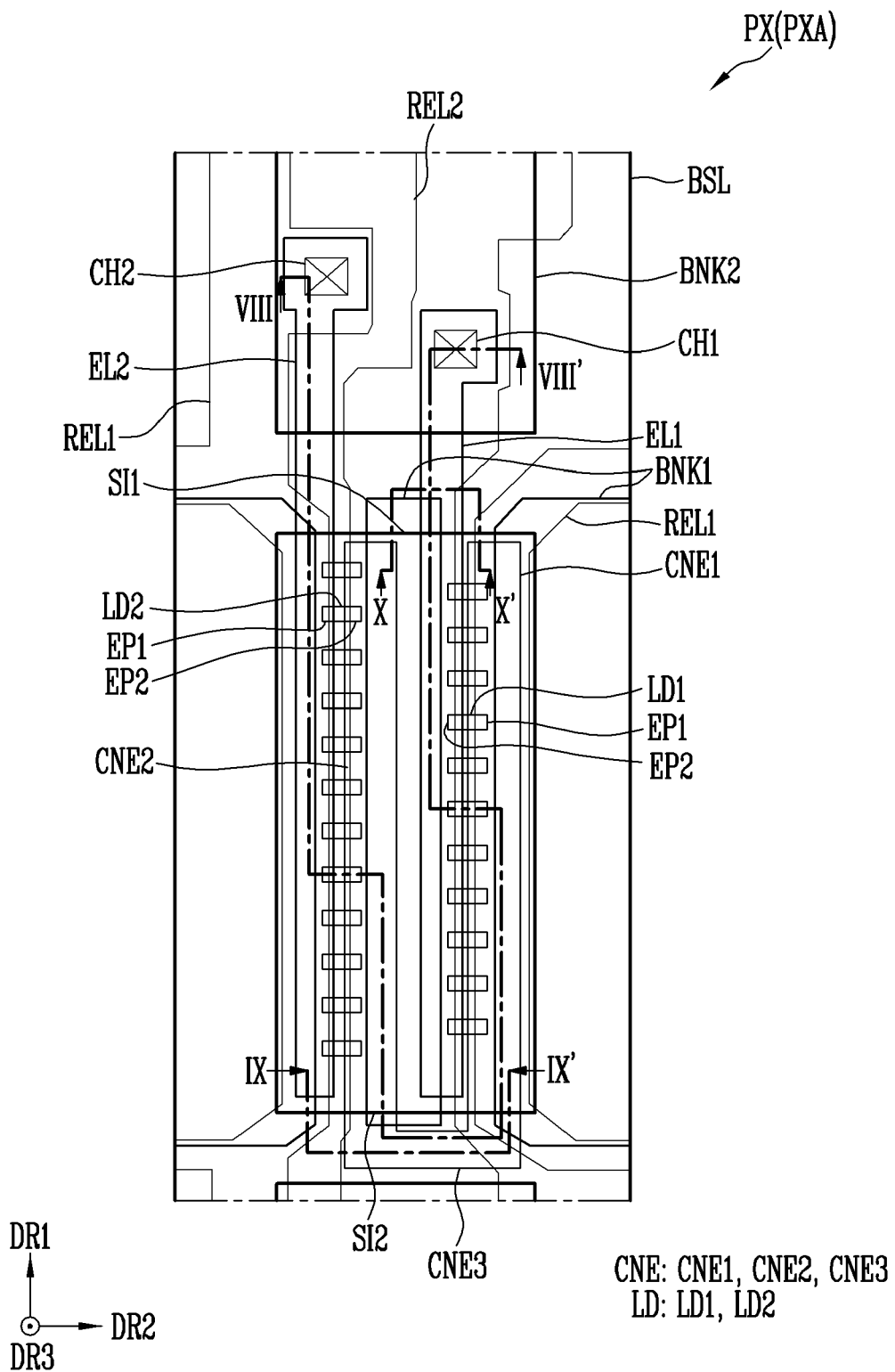
Figure 8:
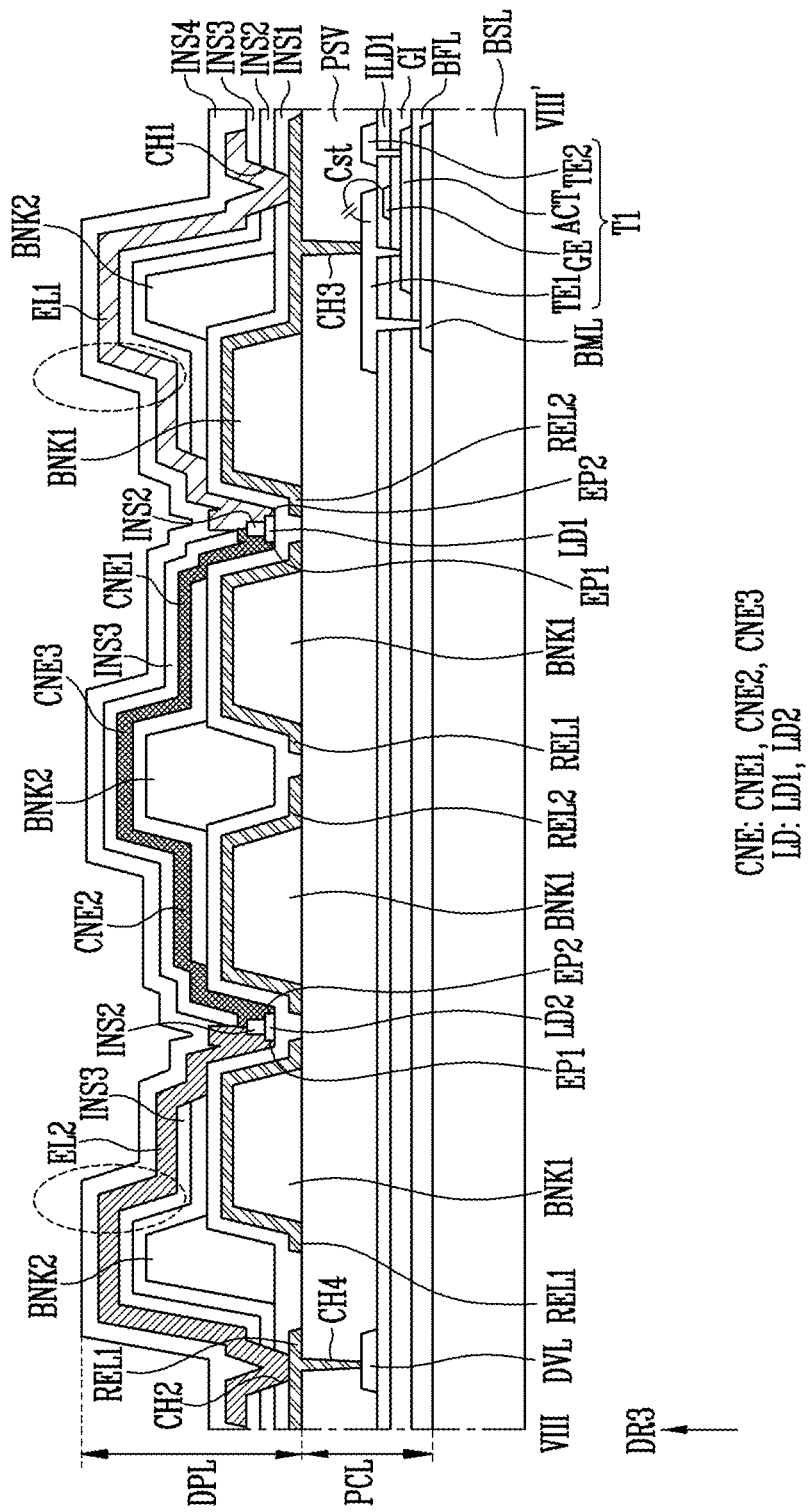
FIG. 8 is a schematic cross-sectional view taken along line VIII-VIII' of FIG. 7.
Figure 9:
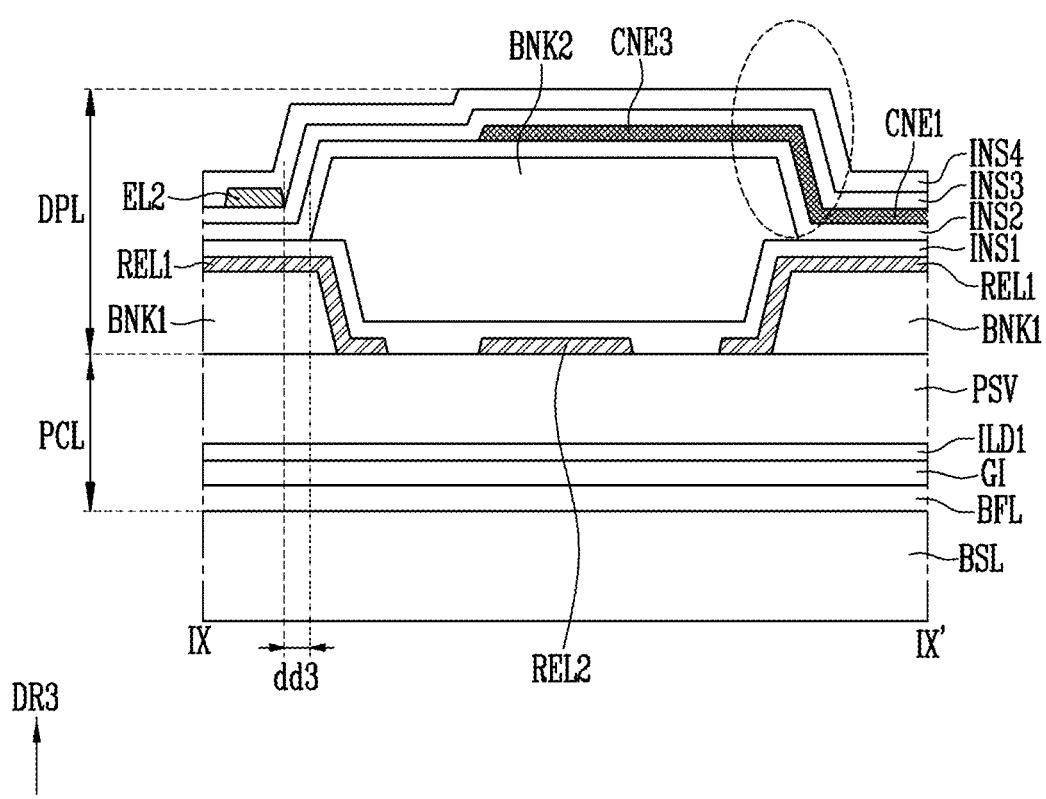
FIG. 9 is a schematic cross-sectional view taken along line IX-IX' of FIG. 7.
Figure 10:
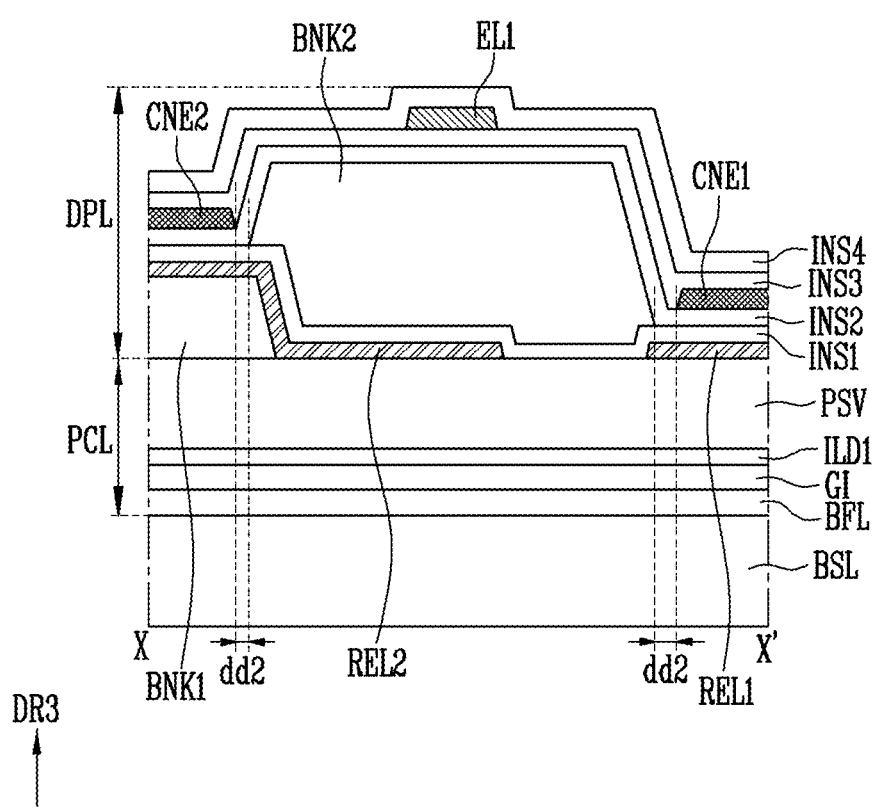
FIG. 10 is a schematic cross-sectional view taken along line X-X' of FIG. 7.

FIGS. 6 and 7 are plan views schematically illustrating an arrangement of a portion area of a pixel of a display device according to an embodiment, FIG. 8 is a schematic cross-sectional view taken along line VIII-VIII' of FIG. 7, FIG. 9 is a schematic cross-sectional view taken along line IX-IX' of FIG. 7, and FIG. 10 is a schematic cross-sectional view taken along line X-X' of FIG. 7. For example, FIGS. 6 and 7 are plan views illustrating an arrangement of a pixel PX illustrated in FIG. 3.

Referring to FIGS. 6 to 10, a pixel PX of the display device according to an embodiment may include the pixel circuit layer PCL and the display element layer DPL stacked on a base layer BSL.

Referring to FIGS. 6 and 7, a pixel PX of the display device according to an embodiment may include a first bank pattern BNK1, a first alignment electrode REL1, a second alignment electrode REL2, a bank BNK2, a light-emitting element LD, a connection electrode CNE, a first pixel electrode EL1, and a second pixel electrode EL2 disposed on the base layer BSL. FIGS. 6 and 7 illustrate a configuration of the display element layer DPL in the display device according to an embodiment. The pixel area PXA of the pixel PX illustrated in FIGS. 6 and 7 may correspond to the pixel areas PXA of a pixel PX.

The first bank pattern BNK1 may be disposed in a light-emitting area from which light may be emitted from the pixel area PXA of the pixel PX. The first bank pattern BNK1 may be a support member supporting the first alignment electrode REL1 and the second alignment electrode REL2, which will be described later, to guide light emitted from the light-emitting elements LD in an image display direction (e.g., the third direction DR3) of the display device.

The first bank pattern BNK1 may include multiple bank patterns supporting each of the first alignment electrode REL1 and the second alignment electrode REL2. For example, the first bank pattern BNK1 may include a bank pattern supporting the first alignment electrode REL1 and may include a bank pattern supporting the second alignment electrode REL2. Accordingly, the first bank pattern BNK1 may be implemented as multiple bank patterns spaced apart from each other.

The first bank pattern BNK1 may have a bar shape extending along the first direction DR1. The disclosure is not limited thereto, and the shape of the first bank pattern BNK1 may be variously changed according to embodiments.

The first alignment electrode REL1 and the second alignment electrode REL2 may extend along the first direction DR1. The first alignment electrode REL1 may include two first alignment electrodes REL1-1 and REL1-2, and the two first alignment electrodes REL1-1 and REL1-2 may be disposed apart from each other in the second direction DR2. The second alignment electrode REL2 may be disposed between the two first alignment electrodes REL1-1 and REL1-2.

The first alignment electrode REL1 and the second alignment electrode REL2 may include a bar portion extending in the first direction DR1 and a portion obliquely bent from the first direction DR1 to the second direction DR2.

The first alignment electrode REL1 may include an extended portion partially extended in the second direction DR2. The extended portion of the first alignment electrode REL1 may be physically and/or electrically connected to the second pixel electrode EL2 to be described later through the second contact hole CH2.

The second alignment electrode REL2 may be physically and/or electrically connected to the first pixel electrode EL1 to be described later through the first contact hole CH1.

The first alignment electrode REL1 and the second alignment electrode REL2 may be disposed to overlap the first bank pattern BNK1. For example, each of the two first alignment electrodes REL1-1 and REL1-2 and the second alignment electrode REL2 may be disposed to overlap the first bank pattern BNK1. For example, one first alignment electrode REL1-1 may be disposed to at least partially overlap one first bank pattern BNK1-1, the other first alignment electrode REL1-2 may be disposed to at least partially overlap another first bank pattern BNK1-2, and one second alignment electrode REL2 may be disposed to at least partially overlap another first bank pattern BNK1-3.

The first alignment electrode REL1 may be disposed to at least partially overlap the first end EP1 of the light-emitting element LD, which will be described later. The second alignment electrode REL2 may be disposed to at least partially overlap the second end EP2 of the light-emitting element LD.

Each of the first alignment electrode REL1 and the second alignment electrode REL2 may be an alignment electrode (or alignment wiring) for aligning the light-emitting elements LD. For example, the first alignment electrode REL1 may be implemented as a first alignment line by receiving a first alignment signal (or a first alignment voltage) from the pixel circuit layer PCL, and the second alignment electrode REL2 may be implemented as a second alignment line by receiving a second alignment signal (or a second alignment voltage) from the pixel circuit layer PCL. Here, the first alignment signal and the second alignment signal may be signals with a voltage difference and/or a phase difference such that the light-emitting elements LD disposed between the first alignment electrode REL1 and the second alignment electrode REL2 can be aligned.

The bank BNK2 may be a structure defining (or partitioning) the pixel area PXA or the light-emitting area of each of a corresponding pixel PX and a pixel PX adjacent thereto, and may be, for example, a pixel definition layer.

The bank BNK2 may overlap at least a portion of the first pixel electrode EL1 and at least a portion of the second pixel electrode EL2, which will be described later, and may be disposed around the light-emitting area to surround the light-emitting area in which the light-emitting elements LD may be disposed. The bank BNK2 may be disposed at one side SI1 of the light-emitting area in the second direction DR2, and may be disposed on the other side SI2 of the light-emitting area that may be disposed to face a side SI1 of the light-emitting area in the first direction DR1 with the light-emitting area interposed therebetween.

The bank BNK2 may be configured to include at least one light blocking material and/or a reflective material, thereby preventing light leakage defects such as where light may leak between the corresponding pixel PX and adjacent pixels PX.

Multiple light-emitting elements LD may be disposed in one pixel PX to constitute the light-emitting unit EMU (refer to FIG. 5). Each of the light-emitting elements LD may emit any one of color light and/or white light. In an embodiment, the light-emitting element LD may include a first light-emitting element LD1 and a second light-emitting element LD2. The first light-emitting element LD1 and the second light-emitting element LD2 may be light-emitting elements LD connected in series in FIG. 5 described above.

The light-emitting elements LD may be injected into the pixel area PXA of each pixel PX through various processes such as an inkjet printing process or a slit coating process. For example, the light-emitting elements LD may be mixed with a volatile solvent and may be supplied to the pixel area PXA through an inkjet printing process or a slit coating process. The first alignment signal and the second alignment signal may be respectively applied to the first alignment electrode REL1 and the second alignment electrode REL2, so that an electric field may be formed between the first alignment electrode REL1 and the second alignment electrode REL2, thereby aligning the light-emitting elements LD. Each of the light-emitting elements LD may be aligned between the first alignment electrode REL1 and the second alignment electrode REL2 to be parallel in the second direction DR2. The first end EP1 of the light-emitting element LD may be aligned toward the first alignment electrode REL1, and the second end EP2 of the light-emitting element LD may be aligned toward the second alignment electrode REL2. After the light-emitting elements LD may be aligned, the solvent may be volatilized or removed by any other method, so that the light-emitting elements LD may be finally provided in the pixel area PXA of the pixel PX.

The connection electrode CNE may include a first vertical portion CNE1 and a second vertical portion CNE2 extending in the first direction DR1, and a horizontal portion CNE3 extending in the second direction DR2. The first vertical portion CNE1 and the second vertical portion CNE2 may be portions extending from one end of the horizontal portion CNE3.

The connection electrode CNE may at least partially overlap the first alignment electrode REL1 and may at least partially overlap the second alignment electrode REL2. For example, the first vertical portion CNE1 of the connection electrode CNE may at least partially overlap the first alignment electrode REL1, and the second vertical portion CNE2 may at least partially overlap the second alignment electrode REL2. Further, the first vertical portion CNE1 may at least partially overlap the second alignment electrode REL2, and the second vertical portion CNE2 may at least partially overlap the first alignment electrode REL1.

The connection electrode CNE may at least partially overlap the light-emitting element LD. For example, the first vertical portion CNE1 of the connection electrode CNE may at least partially overlap the first end EP1 of the light-emitting element LD, and the second vertical portion CNE2 may at least partially overlap the second end EP2. In an embodiment, the first vertical portion CNE1 may be electrically connected to the first end EP1 of the first light-emitting element LD1, and the second vertical portion CNE2 may be electrically connected to the second end EP2 of the second light-emitting element LD2.

The ends of each of the first vertical portion CNE1 and the second vertical portion CNE2 of the connection electrode CNE may be disposed to be spaced apart from the bank BNK2. For example, the end of each of the first vertical portion CNE1 and the second vertical portion CNE2 may be disposed to be spaced apart from the bank BNK2 by a distance dd2 of at least 3 μm in the light-emitting area. For example, the end of each of the first vertical portion CNE1 and the second vertical portion CNE2 may be disposed to be spaced apart from one side SI1 of the bank BNK2.

The horizontal portion CNE3 of the connection electrode CNE may overlap the bank BNK2 disposed at the other side SI2 of the light-emitting area in the second direction DR2. On the other hand, at least a portion of the first vertical portion CNE1 and the second vertical portion CNE2 of the connection electrode CNE may not overlap the bank BNK2. According to an embodiment, the horizontal portion CNE3 of the connection electrode CNE may not overlap the bank BNK2 and may be disposed in the light-emitting area.

Since the connection electrode CNE may electrically connect the first light-emitting element LD1 and the second light-emitting element LD2, in case that a voltage is applied to the connection electrode CNE, the horizontal portion CNE3 of the connection electrode CNE may have the same potential. Accordingly, it may be possible to minimize short-circuit defects due to residues of electrodes that may occur due to a step difference of the connection electrode CNE in a portion overlapping the bank BNK2. Specifically, it may be possible to minimize short-circuit defects that may occur due to residues of electrodes remaining at the other side SI2 of the bank BNK2 in forming the electrodes. An arrangement relationship between the connection electrode CNE and the bank BNK2 will be described in detail through cross-sectional views of FIGS. 8 to 10 below.

The first pixel electrode EL1 and the second pixel electrode EL2 may extend in the first direction DR1. The first pixel electrode EL1 and the second pixel electrode EL2 may have a bar shape, but the disclosure is not limited thereto. In an embodiment, one side of the first pixel electrode EL1 may be physically and/or electrically connected to the second alignment electrode REL2 through the first contact hole CH1. A side of the second pixel electrode EL2 may be physically and/or electrically connected to the first alignment electrode REL1 through the second contact hole CH2.

The first pixel electrode EL1 may at least partially overlap the second alignment electrode REL2. The second pixel electrode EL2 may at least partially overlap the first alignment electrode REL1.

Also, the first pixel electrode EL1 and the second pixel electrode EL2 may at least partially overlap the bank BNK2. The first pixel electrode EL1 and the second pixel electrode EL2 may overlap the bank BNK2 disposed at a side SI1 of the light-emitting area in the second direction DR2.

The first pixel electrode EL1 and the second pixel electrode EL2 may be disposed to be spaced apart from each other in the second direction DR2 at a portion overlapping the bank BNK2. The distance dd1 between the first pixel electrode EL1 and the second pixel electrode EL2 may be at least 7 µm. Accordingly, even in case that different voltages are applied to the first pixel electrode EL1 and the second pixel electrode EL2, it may be possible to minimize short-circuit defects due to the residues of the electrodes that may occur due to a step difference between the first pixel electrode EL1 and the second pixel electrode EL2 in a portion overlapping the bank BNK2. Specifically, it may be possible to minimize short-circuit defects that may occur due to residues of electrodes remaining at one side SI1 of the bank BNK2 in forming the electrodes.

The other side of the first pixel electrode EL1 and the other side of the second pixel electrode EL2 may be disposed in the light-emitting area of the corresponding pixel PX. Further, an end of the other side of the first pixel electrode EL1 and an end of the other side of the second pixel electrode EL2 may be disposed to be spaced apart from the bank BNK2. For example, a distance dd3 between an end of the other side of the first pixel electrode EL1 and the bank BNK2 may be at least 3 µm, and a distance dd3 between an end of the other side of the second pixel electrode EL2 and the bank BNK2 may be at least 3 µm.

The first pixel electrode EL1 and the second pixel electrode EL2 may be disposed to be spaced apart from the connection electrode CNE. Specifically, the first pixel electrode EL1 may be disposed to be spaced apart from the first vertical portion CNE1 and the second vertical portion CNE2 of the connection electrode CNE, and the second pixel electrode EL2 may be disposed to be spaced apart from the second vertical portion CNE2 of the connection electrode CNE.

The first pixel electrode EL1 may at least partially overlap the second end EP2 of the light-emitting element LD. The second pixel electrode EL2 may at least partially overlap the first end EP1 of the light-emitting element LD. For example, the second end EP2 of the first light-emitting element LD1 may be electrically connected to the first pixel electrode EL1, and the first end EP1 of the second light-emitting element LD2 may be electrically connected to the electrode EL2.

The first pixel electrode EL1 may be an anode to which the first driving voltage VDD of FIG. 5 may be applied. The second pixel electrode EL2 may be a cathode to which the second driving voltage VSS of FIG. 5 may be applied. Accordingly, the first driving voltage VDD may be applied to the second end EP2 of the light-emitting element LD through the first pixel electrode EL1, and the second driving voltage VSS may be applied to the first end EP1 of the light-emitting element LD. In an embodiment, the first driving voltage VDD may be a voltage having a higher level than the second driving voltage VSS. At this time, a driving current may flow through the first pixel electrode EL1, the second end EP2 of the light-emitting element LD, the connection electrode CNE, the first end EP1 of the light-emitting element LD, and the second pixel electrode EL2 in the pixel PX. The current flow of the pixel PX will be described in detail with reference to FIG. 11 below.

Referring to FIGS. 8 to 10, the pixel circuit layer PCL of the display device according to an embodiment may include a buffer layer BFL, a first transistor T1, and a driving voltage line DVL, a gate insulating layer GI, a first interlayer insulating layer ILD1, and a passivation layer PSV disposed on the base layer BSL.

The buffer layer BFL may be disposed to cover an entire surface of the base layer BSL, and may prevent impurities from diffusing into the transistors. The buffer layer BFL may be an inorganic insulating layer including an inorganic material. The buffer layer BFL may include at least one of metal oxides such as silicon nitride ($SiN_x$), silicon oxide ($SiO_x$), silicon oxynitride ($SiO_xN_y$), aluminum oxide ($AlO_x$), and the like. The buffer layer BFL may be provided as a single layer, but may also be provided as multiple layers having at least a double layer. In case that the buffer layer BFL is provided as multiple layers, each layer may be formed of the same material or different materials. The buffer layer BFL may be omitted depending on the material and process conditions of the base layer BSL.

A bottom metal layer BML may be disposed between the buffer layer BFL and the base layer BML. The bottom metal layer BML may be included in the first transistor T1 to be described later, and the bottom metal layer BML and the gate electrode GE of the first transistor T1 may overlap each other with the buffer layer BFL interposed therebetween. The bottom metal layer BML may be disposed under the active layer ACT of the first transistor T1. The bottom metal layer BML may serve as a light blocking pattern, thereby stabilizing operating characteristics of the first transistor T1. According to an embodiment, the first transistor T1 may not include the bottom metal layer BML, and the buffer layer BFL may be disposed (e.g., directly disposed) on the base layer BSL. The bottom metal layer BML may be physically and/or electrically connected to the first electrode TE1 of the first transistor T1, which will be described later, through a contact hole of the insulating layer. Accordingly, the threshold voltage of the first transistor T1 may be moved in a negative direction or a positive direction.

Multiple transistors may be disposed on the buffer layer BFL. Multiple transistors may include a driving transistor that controls the driving current of the light-emitting elements LD, and a switching transistor connected to the driving transistor. Here, the driving transistor may correspond to the first transistor T1 of FIG. 5 described above.

The first transistor T1 may include an active layer ACT, a gate electrode GE, a first electrode TE1, and a second electrode TE2. The first electrode TE1 may be one of a source electrode and a drain electrode, and the second electrode TE2 may be the other electrode. For example, in case that the first electrode TE1 may be a drain electrode, the second electrode TE2 may be a source electrode.

The active layer ACT may be disposed on the buffer layer BFL. The active layer ACT may include a drain region, a source region, and a channel region. The drain region may be electrically and/or physically connected to the first electrode TE1 of the first transistor T1, and the source region may be electrically and/or physically connected to the second electrode TE2 of the first transistor T1. According to an embodiment, the drain region may be connected to the second electrode TE2, and the source region may be connected to the first electrode TE1. The channel region may be disposed to overlap the gate electrode GE of the first transistor T1. The active layer ACT may be made of at least one of poly silicon, amorphous silicon, an oxide semiconductor, or the like.

The gate insulating layer GI may be disposed on the active layer ACT to cover the active layer ACT and the buffer layer BFL. The gate insulating layer GI may be an inorganic insulating layer including an inorganic material. For example, the gate insulating layer GI may include at least one of a metal oxide such as silicon nitride ($SiN_x$), silicon oxide ($SiO_x$), silicon oxynitride ($SiO_xN_y$), aluminum oxide ($AlO_x$), and the like. According to an embodiment, the gate insulating layer GI may be formed of an organic insulating layer including an organic material. The gate insulating layer GI may be provided as a single layer, or may be also provided as multiple layers having at least a double layer.

The gate electrode GE may be disposed on the gate insulating layer GI to overlap the channel region of the active layer ACT. The gate electrode GE may be formed of a single layer as alone or a mixture thereof, which may be selected from the group of copper (Cu), molybdenum (Mo), tungsten (W), aluminum neodymium (AlNd), titanium (Ti), aluminum (Al), silver (Ag), and alloys thereof. The gate electrode GE may be formed of a double-layer or multi-layer structure made of a low resistance material such as molybdenum (Mo), titanium (Ti), copper (Cu), aluminum (Al), silver (Ag), or a combination thereof.

The first interlayer insulating layer ILD1 may be disposed on the gate electrode GE to cover the gate insulating layer GI. The first interlayer insulating layer ILD1 may include the same material as the gate insulating layer GI, or may include at least one material selected from materials discussed as constituent materials of the gate insulating layer GI.

The first electrode TE1 of the first transistor T1 and the second electrode TE2 of the first transistor T1 may be disposed on the first interlayer insulating layer ILD1, and may be connected to the source region and the drain region of the active layer ACT, respectively, through openings sequentially penetrating the gate insulating layer GI and the first interlayer insulating layer ILD1.

The first electrode TE1 of the first transistor T1 may be disposed to partially overlap the gate electrode GE. Here, a portion at which the first electrode TE1 of the first transistor T1 overlaps the gate electrode GE may constitute the storage capacitor Cst. Here, the storage capacitor Cst may be the storage capacitor Cst of FIG. 5 described above.

The driving voltage line DVL may be disposed on the first interlayer insulating layer ILD1. The driving voltage line DVL may be disposed on the same layer as the first electrode TE1 and the second electrode TE2 of the first transistor T1 and may include the same material. The disclosure is not limited thereto. According to an embodiment, the driving voltage line DVL may be disposed on the same layer as any of the conductive layers provided in the pixel circuit layer PCL.

The driving voltage line DVL may have the same configuration as the second power line PL2 of FIG. 5 described above. Accordingly, the second driving voltage VSS may be applied to the driving voltage line DVL. Although not shown in the drawing, the pixel circuit layer PCL may further include a first power line PL1 (refer to FIG. 5) connected to the first driving voltage VDD (refer to FIG. 5). The first power line PL1 may be electrically connected to one configuration of the display element layer DPL, for example, the first pixel electrode EL1, and the driving voltage line DVL may be electrically connected to another configuration of the display element layer DPL, for example, the second pixel electrode EL2.

The passivation layer PSV may be disposed on the first interlayer insulating layer ILD1 to cover the first transistor T1, the driving voltage line DVL, and the first interlayer insulating layer ILD1. The passivation layer PSV may include an organic insulating layer and/or an inorganic insulating layer. The inorganic insulating layer may include at least one of metal oxides such as silicon oxide ($SiO_x$), silicon nitride ($SiN_x$), silicon oxynitride ($SiO_xN_y$), and aluminum oxide ($AlO_x$). The organic insulation layer may include at least one selected from the group of polyacrylates resin, epoxy resin, phenolic resin, polyamides resin, polyimide resin, unsaturated polyester resin, poly-phenylen ethers resin, poly-phenylene sulfides resin, and benzocyclobutene resin.

The passivation layer PSV may include a third contact hole CH3 exposing the first electrode TE1 of the first transistor T1 and a fourth contact hole CH4 exposing the driving voltage line DVL. The first electrode TE1 of the pixel circuit layer PCL may be electrically and/or physically connected to the first pixel electrode EL1 of the display element layer DPL through the third contact hole CH3, and the driving voltage line DVL of the pixel circuit layer PCL may be electrically and/or physically connected to the second pixel electrode EL2 of the display element layer DPL through the fourth contact hole CH4.

The display element layer DPL may be disposed on the passivation layer PSV.

The display element layer DPL may include a first bank pattern BNK1, a first alignment electrode REL1, a second alignment electrode REL2, a bank BNK2, a light-emitting element LD, a connection electrode CNE, and a first pixel electrode EL1, a second pixel electrode EL2, and insulating layers INS1, INS2, INS3, and INS4.

The first bank pattern BNK1 may be disposed on the passivation layer PSV.

The first bank pattern BNK1 may have a trapezoidal cross section whose width decreases from one surface (e.g., an upper surface) of the passivation layer PSV toward the top in the third direction DR3, but the disclosure is not limited thereto. According to an embodiment, the first bank pattern BNK1 may include a curved surface having a cross section of a semi-elliptical shape, a semi-circular shape (or hemispherical shape), etc., whose width becomes narrower toward the top from one surface of the passivation layer PSV in the third direction DR3. The shape of the first bank pattern BNK1 is not limited to the above-described embodiments, and may be variously changed within a range capable of improving the efficiency of light emitted from each of the light-emitting elements LD.

The first bank pattern BNK1 may be an inorganic insulating layer including an inorganic material or an organic insulating layer including an organic material. According to an embodiment, the first bank pattern BNK1 may include an organic insulating layer of a single layer and/or an inorganic insulating layer of a single layer, but the disclosure is not limited thereto. According to an embodiment, the first bank pattern BNK1 may be provided in the form of multiple layers in which at least one organic insulating layer and at least one inorganic insulating layer may be stacked on each other. However, the material of the first bank pattern BNK1 is not limited to the above-described embodiment, and according to an embodiment, the first bank pattern BNK1 may include a conductive material.

The first alignment electrode REL1 and the second alignment electrode REL2 may be disposed on the passivation layer PSV and/or the first bank pattern BNK1.

The first alignment electrode REL1 may be electrically and/or physically connected to the driving voltage line DVL through the fourth contact hole CH4 of the passivation layer PSV. The second alignment electrode REL2 may be electrically and/or physically connected to the first electrode TE1 of the first transistor T1 through the third contact hole CH3 of the passivation layer PSV. For example, an alignment signal for aligning the light-emitting element LD may be applied to each of the first alignment electrode REL1 and the second alignment electrode REL2, and a driving voltage for driving the pixel PX may be applied to each thereof. For example, the first alignment electrode REL1 may be a bridge electrode for applying the second driving voltage VSS (refer to FIG. 5) to the second pixel electrode EL2, and the second alignment electrode REL2 may be a bridge electrode for applying the first driving voltage VDD (refer to FIG. 5) to the first pixel electrode EL1.

Each of the first alignment electrode REL1 and the second alignment electrode REL2 may be made of a material having constant reflectance in order to propagate light emitted from the light-emitting element LD in an image display direction (e.g., the third direction DR3) of the display device. For example, each of the first alignment electrode REL1 and the second alignment electrode REL2 may be formed of a single layer including conductive oxides such as indium tin oxide (ITO), indium zinc oxide (IZO), zinc oxide (ZnO), indium gallium zinc oxide (IGZO), indium tin zinc oxide (ITZO), conductive polymers such as PEDOT (poly(3,4-ethylenedioxythiophene)), or the like, or a combination thereof. Each of the first alignment electrode REL1 and the second alignment electrode REL2 may be formed of multiple layers further including metals such as silver (Ag), magnesium (Mg), aluminum (Al), platinum (Pt), palladium (Pd), gold (Au), nickel (Ni), neodymium (Nd), iridium (Ir), chromium (Cr), titanium (Ti), and an alloy thereof.

The first insulating layer INS1 may be disposed on the first alignment electrode REL1 and the second alignment electrode REL2 to cover the first alignment electrode REL1, the second alignment electrode REL2, and the passivation layer PSV. The first insulating layer INS1 may include an inorganic insulating layer made of an inorganic material or an organic insulating layer made of an organic material. For example, the first insulating layer INS1 may include at least one of metal oxides such as silicon nitride ($SiN_x$), silicon oxide ($SiO_x$), silicon oxynitride ($SiO_xN_y$), and aluminum oxide ($AlO_x$), but the disclosure is not limited thereto. The first insulating layer INS1 may be formed of an inorganic insulating layer that may be advantageous for protecting the light-emitting elements LD from the pixel circuit layer PCL.

The first insulating layer INS1 may include a second contact hole CH2 partially exposing an upper surface of the first alignment electrode REL1, and a first contact hole CH1 partially exposing an upper surface of the second alignment electrode REL2.

The bank BNK2 may be disposed on the first insulating layer INS1. The bank BNK2 may be a dam structure that prevents a solution mixed with the light-emitting elements LD from flowing into the light-emitting area of the adjacent pixel PX, or controls a certain amount of solution to be supplied to each light-emitting area in a step of supplying the light-emitting elements LD to the light-emitting area from which light may be emitted.

The light-emitting elements LD may be disposed on the first insulating layer INS1.

The light-emitting elements LD may be disposed between the first alignment electrode REL1 and the second alignment electrode REL2 so that a length direction of the light-emitting elements LD may be parallel to the first direction DR1. The first end EP1 of the light-emitting element LD may be disposed to face the first alignment electrode REL1, and the second end EP2 of the light-emitting element LD may be disposed to face the second alignment electrode REL2.

The second insulating layer INS2 may be disposed on the bank BNK2, the first insulating layer INS1, and the light-emitting element LD. The second insulating layer INS2 may be disposed to cover the upper surface of the bank BNK2, and may be disposed to cover at least a portion of the upper surface of the first insulating layer INS1. The second insulating layer INS2 may be disposed on the upper surface of the light-emitting element LD so that the first end EP1 and the second end EP2 of the light-emitting element LD may be exposed. After the light-emitting elements LD may be aligned, the second insulating layer INS2 may prevent the light-emitting elements LD from being separated from aligned positions by fixing the light-emitting elements LD.

The second insulating layer INS2 may include a second contact hole CH2 partially exposing the upper surface of the first alignment electrode REL1, and a first contact hole CH1 partially exposing the upper surface of the second alignment electrode REL2.

The second insulating layer INS2 may be formed of a single layer or multiple layers, and may include an inorganic insulating layer including at least one inorganic material or an organic insulating layer including at least one organic material. For example, the second insulating layer INS2 may include at least one of metal oxides such as silicon nitride ($SiN_x$), silicon oxide ($SiO_x$), silicon oxynitride ($SiO_xN_y$), and aluminum oxide ($AlO_x$), but the disclosure is not limited thereto.

The connection electrode CNE may be disposed on the second insulating layer INS2 and the first insulating layer INS1. The connection electrode CNE may be disposed to partially overlap the first alignment electrode REL1 and the second alignment electrode REL2 disposed on the first bank pattern BNK1.

The connection electrode CNE may contact the first end EP1 or the second end EP2 of the light-emitting elements LD. Accordingly, the connection electrode CNE may electrically connect the light-emitting elements LD disposed between the first alignment electrode REL1 and the second alignment electrode REL2. The light-emitting elements LD shown here may be a configuration of the series-connected light-emitting elements LD of FIG. 5 described above.

Referring to FIG. 9, a positional relationship between the horizontal portion CNE3 and the first vertical portion CNE1 of the connection electrode CNE can be confirmed.

The connection electrode CNE may be disposed on the second insulating layer INS2 and may be disposed to at least partially overlap the bank BNK2. The horizontal portion CNE3 of the connection electrode CNE may be disposed on the second insulating layer INS2 covering the bank BNK2, and the first vertical portion CNE1 of the connection electrode CNE may be disposed on the second insulating layer INS2 covering the first alignment electrode REL1. Accordingly, a step difference (a portion shown by a dotted line) may occur in the connection electrode CNE due to a difference in height of the second insulating layer INS2. In an embodiment, since a voltage of the same potential may be applied to the connection electrode CNE, even if a step difference occurs in the connection electrode CNE, short-circuit defects that may occur due to the residue of the electrode remaining in the bank BNK2 in forming the electrode, can be minimized. Specifically, referring to FIGS. 6 and 7, in a plan view, short-circuit defects that may occur due to the residue of electrode of remaining on the other side SI2 of the bank BNK2 in forming the electrode, can be minimized.

Referring to FIG. 10, a positional relationship between the first vertical portion CNE1 and the second vertical portion CNE2 of the connection electrode CNE can be confirmed.

The first vertical portion CNE1 of the connection electrode CNE and the second vertical portion CNE2 of the connection electrode CNE may be disposed to be spaced apart from each other in the second direction DR2 with the bank BNK2 interposed therebetween. Since end portions of the first vertical portion CNE1 and the second vertical portion CNE2 of the connection electrode CNE may be disposed to be spaced apart from the bank BNK2, step differences may not occur in the first vertical portion CNE1 and the second vertical portion CNE2 of the connection electrode CNE. In an embodiment, a distance dd2 between the end of the first vertical portion CNE1 and the bank BNK2 may be at least 3 μm. A distance dd2 between the end of the second vertical portion CNE2 and the bank BNK2 may be at least 3 μm.

The first pixel electrode EL1 may be disposed on the bank BNK2. The first driving voltage VDD may be applied to the first pixel electrode EL1, and the driving current due to the first driving voltage VDD of the first pixel electrode EL1 may flow in the first vertical portion CNE1 and the second vertical portion CNE2 of the connection electrode CNE. For example, voltages of the same potential may be applied to the first vertical portion CNE1 and the second vertical portion CNE2 of the connection electrode CNE, but the first vertical portion CNE1 and the second vertical portion CNE2 of the connection electrode CNE may have a potential different from the voltage applied to the first pixel electrode EL1. However, in an embodiment, since the ends of the first vertical portion CNE1 and the second vertical portion CNE2 of the connection electrode CNE may be disposed to be spaced apart from the bank BNK2 and the first pixel electrode EL1, even if a different voltage may be applied to the pixel electrode EL1, short-circuit defects that may occur due to the residues of the first pixel electrode EL1 and/or the connection electrode CNE remaining in the bank BNK2 in forming the first pixel electrode EL1 and/or the connection electrode CNE, can be minimized. Specifically, referring to FIGS. 6 and 7, in a plan view, short-circuit defects that may occur due to the residues of the electrodes remaining at one side SI1 of the bank BNK2 in forming the electrode, can be minimized.

The third insulating layer INS3 may be disposed on the second insulating layer INS2 and the connection electrode CNE. The third insulating layer INS3 may be disposed to cover at least a portion of the upper surface of the second insulating layer INS2. Also, the third insulating layer INS3 may be disposed to cover the upper surface of the connection electrode CNE.

The third insulating layer INS3 may include a second contact hole CH2 partially exposing the upper surface of the first alignment electrode REL1, and a first contact hole CH1 partially exposing the upper surface of the second alignment electrode REL2.

The third insulating layer INS3 may be formed of a single layer or multiple layers, and may include an inorganic insulating layer including at least one inorganic material or an organic insulating layer including at least one organic material. For example, the third insulating layer INS3 may include at least one of metal oxides such as silicon nitride ($SiN_x$), silicon oxide ($SiO_x$), silicon oxynitride ($SiO_xN_y$), and aluminum oxide ($AlO_x$), but the disclosure is not limited thereto.

The first pixel electrode EL1 and the second pixel electrode EL2 may be disposed on the third insulating layer INS3 and the first insulating layer INS1.

The first pixel electrode EL1 may be electrically and/or physically connected to the second alignment electrode REL2 through the first contact hole CH1 of the first, second, and third insulating layers INS1, INS2, and INS3. Since the second alignment electrode REL2 may be connected to the first electrode TE1 of the first transistor T1, the first driving voltage VDD may be applied to the first pixel electrode EL1. The first pixel electrode EL1 may partially overlap the first insulating layer INS1 and may contact the second end EP2 of the light-emitting element LD. Accordingly, the first driving voltage VDD may be applied to the second end EP2 of the light-emitting element LD.

The second pixel electrode EL2 may be electrically and/or physically connected to the first alignment electrode REL1 through the second contact hole CH2 of the first, second, and third insulating layers INS1, INS2, and INS3. Since the first alignment electrode REL1 may be connected to the driving voltage line DVL, the second driving voltage VSS may be applied to the second pixel electrode EL2. The second pixel electrode EL2 may partially overlap the first insulating layer INS1 and may contact the first end EP1 of the light-emitting element LD. Accordingly, the second driving voltage VSS may be applied to the first end EP1 of the light-emitting element LD.

The first pixel electrode EL1 may be disposed on the third insulating layer INS3 and may be disposed to at least partially overlap the bank BNK2. Another portion of the first pixel electrode EL1 may be disposed to overlap the first bank pattern BNK1 and the second alignment electrode REL2. Accordingly, a step difference (a portion shown by a dotted line in FIG. 8) may occur in the first pixel electrode EL1 due to a difference in height of the third insulating layer INS3.

The second pixel electrode EL2 may be disposed on the third insulating layer INS3 and may be disposed to at least partially overlap the bank BNK2. Another portion of the second pixel electrode EL2 may be disposed to overlap the first bank pattern BNK1 and the first alignment electrode REL1. Accordingly, a step difference (a portion shown by a dotted line in FIG. 8) may occur in the second pixel electrode EL2 due to a difference in height of the third insulating layer INS3.

However, referring again to FIG. 6, in the display device according to an embodiment, since the first pixel electrode EL1 and the second pixel electrode EL2 may be sufficiently spaced apart from each other in a portion overlapping the bank BNK2, even if a step difference occurs between the first pixel electrode EL1 and the second pixel electrode EL2, short-circuit defects due to the residue of the electrode can be minimized. Specifically, it may be possible to minimize short-circuit defects that may occur due to residues of electrodes remaining at one side SI1 of the bank BNK2 in forming the electrodes.

Referring again to FIGS. 6 and 9, an end of the other side of the second pixel electrode EL2 may be disposed to be spaced apart from the bank BNK2. For example, a distance dd3 between the end of the other side of the second pixel electrode EL2 and the bank BNK2 may be at least 3 μm. As shown in FIG. 9, the second pixel electrode EL2 may be disposed to be spaced apart from the connection electrode CNE with the bank BNK2 interposed therebetween in a cross-sectional view. Accordingly, even if voltages of different potentials may be applied to the second pixel electrode EL2 and the connection electrode CNE, and a step difference occurs in the connection electrode CNE, short circuit defects that may occur due to the residue of the second pixel electrode EL2 and/or the connection electrode CNE remaining in the bank BNK2 in forming the second pixel electrode EL2 and/or the connection electrode CNE, can be minimized. Specifically, in a plan view, it may be possible to minimize short-circuit defects that may occur due to the residues of the electrodes remaining at the other side SI2 of the bank BNK2 in forming the electrode.

Each of the first pixel electrode EL1 and the second pixel electrode EL2 may be made of a material having a constant reflectance in order to propagate light emitted from each of the light-emitting elements LD in an image display direction (e.g., the third direction DR3) of the display device. The first pixel electrode EL1 and the second pixel electrode EL2 may be formed of a conductive material having a constant reflectance. The conductive material may include an opaque metal that may be advantageous for reflecting light emitted from the light-emitting elements LD in the image display direction (e.g., the third direction DR3) of the display device. The opaque metal may include, for example, metals such as silver (Ag), magnesium (Mg), aluminum (Al), platinum (Pt), palladium (Pd), gold (Au), nickel (Ni), neodymium (Nd), iridium (Ir), chromium (Cr), titanium (Ti), and alloys thereof. According to an embodiment, the first pixel electrode EL1 and the second pixel electrode EL2 may include a transparent conductive material. The transparent conductive material may include a conductive oxide such as indium tin oxide (ITO), indium zinc oxide (IZO), zinc oxide (ZnO), indium gallium zinc oxide (IGZO), and indium tin zinc oxide (ITZO), a conductive polymer such as poly(3,4-ethylenedioxythiophene) (PEDOT), or a combination thereof. In case that the first pixel electrode EL1 and the second pixel electrode EL2 include a transparent conductive material, a separate conductive layer made of an opaque metal for reflecting light emitted from the light-emitting elements LD to the image display direction (e.g., the third direction DR3) of the display device, may be added. However, the materials of the first pixel electrode EL1 and the second pixel electrode EL2 are not limited to the above-described materials.

The fourth insulating layer INS4 may be disposed on the first pixel electrode EL1, the second pixel electrode EL2, and the third insulating layer INS3. The fourth insulating layer INS4 may be disposed to entirely cover the upper surface of the first pixel electrode EL1 and to entirely cover the upper surface of the second pixel electrode EL2. The fourth insulating layer INS4 may be disposed to cover at least a portion of the third insulating layer INS3.

The fourth insulating layer INS4 may be an inorganic insulating layer including an inorganic material. For example, the fourth insulating layer INS4 may include at least one of metal oxides such as silicon nitride ($SiN_x$), silicon oxide ($SiO_x$), silicon oxynitride ($SiO_xN_y$), and aluminum oxide ($AlO_x$), but the disclosure is not limited thereto. According to an embodiment, the fourth insulating layer INS4 may have a structure in which at least one inorganic insulating layer or at least one organic insulating layer may be alternately stacked on each other. The fourth insulating layer INS4 may entirely cover the display element layer DPL to prevent water or moisture from flowing into the display element layer DPL including the light-emitting elements LD.

According to an embodiment, the display element layer DPL may be configured to selectively further include an optical layer in addition to the fourth insulating layer INS4. Here, the optical layer may include a color conversion layer including color conversion particles that convert light emitted from the light-emitting elements LD into light of a specific color.

Hereinafter, with reference to FIG. 11, a current path in case that the pixel PX shown in FIG. 5 may be driven will be described.

Figure 11:
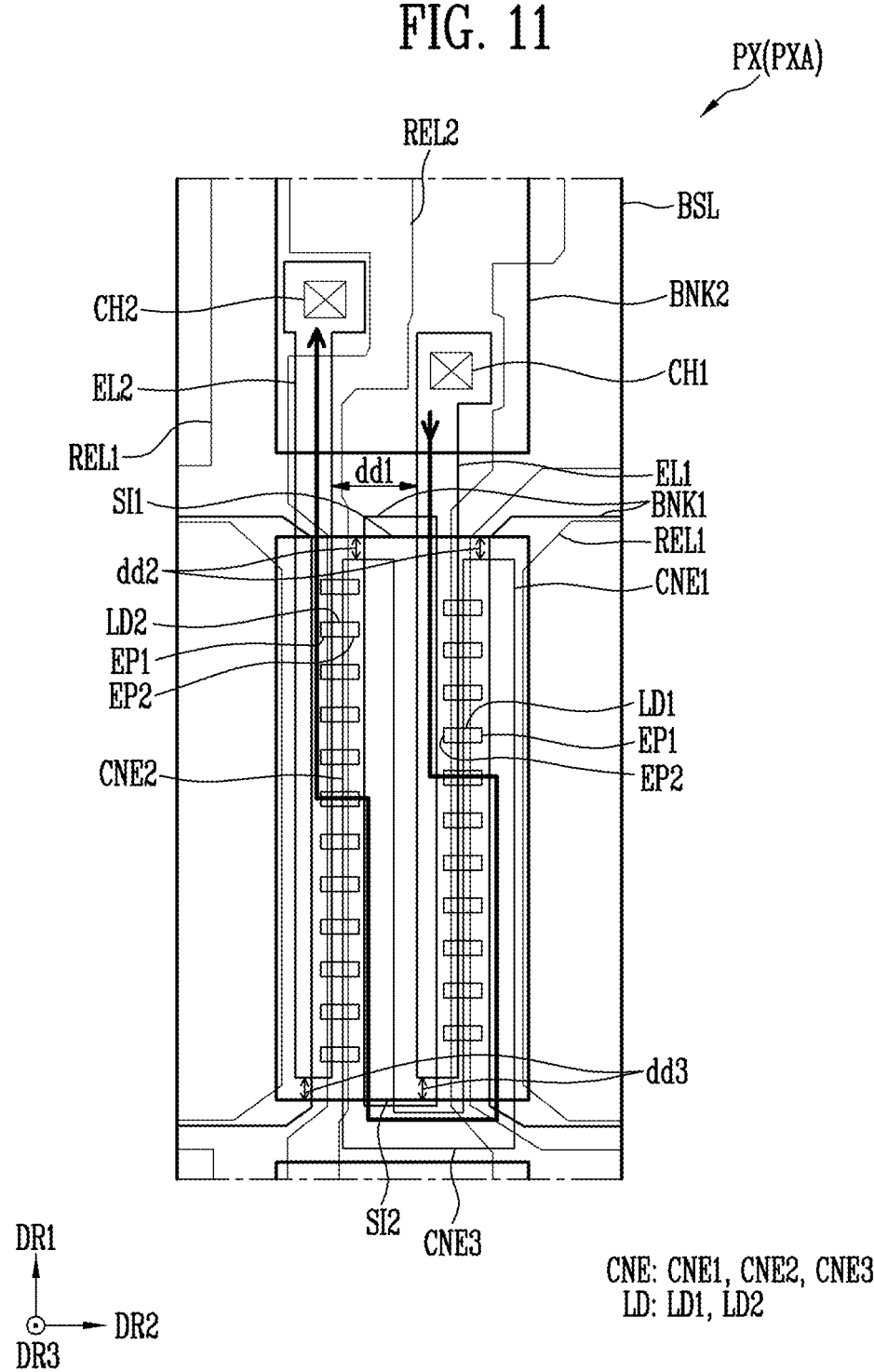
FIG. 11 is a plan view schematically illustrating an example of a current path in the pixel illustrated in FIG. 5.

FIG. 11 is a plan view schematically illustrating an example of a current path in the pixel illustrated in FIG. 5.

Referring to FIG. 11, the first driving voltage VDD may be applied to the first pixel electrode EL1 through the first contact hole CH1, and the second driving voltage VSS may be applied to the second pixel electrode EL2 through the second contact hole CH2. In an embodiment, the first driving voltage VDD may be higher than the second driving voltage VSS. Accordingly, a driving current due to a voltage difference between the first driving voltage VDD and the second driving voltage VSS may flow from the first pixel electrode EL1 to the second pixel electrode EL2.

The driving current may flow through the second end EP2 of the first light-emitting element LD1 overlapping (or in contact with) the first pixel electrode EL1, and the driving current may flow through the first vertical portion CNE1 of the connection electrode CNE overlapping (or in contact with) the first end EP1 of the first light-emitting element LD1. The driving current may be applied to the second end EP2 of the second light-emitting element LD2 overlapping (or in contact with) the second vertical portion CNE2 of the connection electrode CNE, so that the driving current may flow to the second pixel electrode EL2 overlapping (or in contact with) the first end EP1 of the second light-emitting element LD.

In an embodiment, the first pixel electrode EL1 and the second pixel electrode EL2 may be disposed to be spaced apart from each other at a portion overlapping the bank BNK2. For example, the first pixel electrode EL1 and the second pixel electrode EL2 may be disposed with a distance dd1 of at least 7 μm. At this time, voltages having different potentials may be applied to the first pixel electrode EL1 and the second pixel electrode EL2, but the first pixel electrode EL1 and the second pixel electrode EL2 may be disposed apart from each other, and thus short-circuit defects may occur due to the residue of the electrode remaining in the bank BNK2 in forming the electrode, can be minimized even if a step difference due to the bank BNK2 occurs in the first pixel electrode EL1 and the second pixel electrode EL2. Specifically, it may be possible to minimize short-circuit defects that may occur due to residues of electrodes remaining at one side SI1 of the bank BNK2 in forming the electrodes.

A driving current may flow through the first vertical portion CNE1, the horizontal portion CNE3, and the second vertical portion CNE2 of the connection electrode CNE, and a voltage of the same potential may be maintained in the connection electrode CNE. The horizontal portion CNE3 of the connection electrode CNE may be disposed to overlap the bank BNK2. Accordingly, in case that a voltage is applied to the connection electrode CNE, the horizontal portion CNE3 of the connection electrode CNE may have the same potential, and thus, it may be possible to minimize short-circuit defects that may occur due to the residue of the electrode remaining in the bank BNK2 in forming the electrode. Specifically, it may be possible to minimize short-circuit defects that may occur due to residues of electrodes remaining at the other side SI2 of the bank BNK2 in forming the electrodes.

In an embodiment, since the ends of the first vertical portion CNE1 and the second vertical portion CNE2 of the connection electrode CNE may be disposed to be spaced apart from the bank BNK2, even if a voltage different from the connection electrode may be applied to the pixel electrode EL1, short-circuit defects that may occur due to the residues of the first pixel electrode EL1 and/or the connection electrode CNE remaining in the bank BNK2 in forming the first pixel electrode EL1 and/or the connection electrode CNE, can be minimized. Specifically, it may be possible to minimize short-circuit defects that may occur due to residues of electrodes remaining at one side SI1 of the bank BNK2 in forming the electrodes.

In an embodiment, since the end of the other side of the first pixel electrode EL1 and the end of the other side of the second pixel electrode EL2 may be disposed apart from the bank BNK2, it may be possible to minimize short-circuit defects that may occur due to the residues of the first and second pixel electrodes EL1 and EL2 and/or the connection electrode CNE remaining in the bank BNK2 in forming the first and second pixel electrodes EL1 and EL2 and/or the connection electrode CNE even if a voltage different from the first pixel electrode EL1 and the second pixel electrode EL2 may be applied to the connection electrode CNE. Specifically, it may be possible to minimize short-circuit defects that may occur due to residues of electrodes remaining at one side SI1 of the bank BNK2 in forming the electrodes.

Hereinafter, a display device according to an embodiment will be described with reference to FIGS. 12 and 13.

Figure 12:
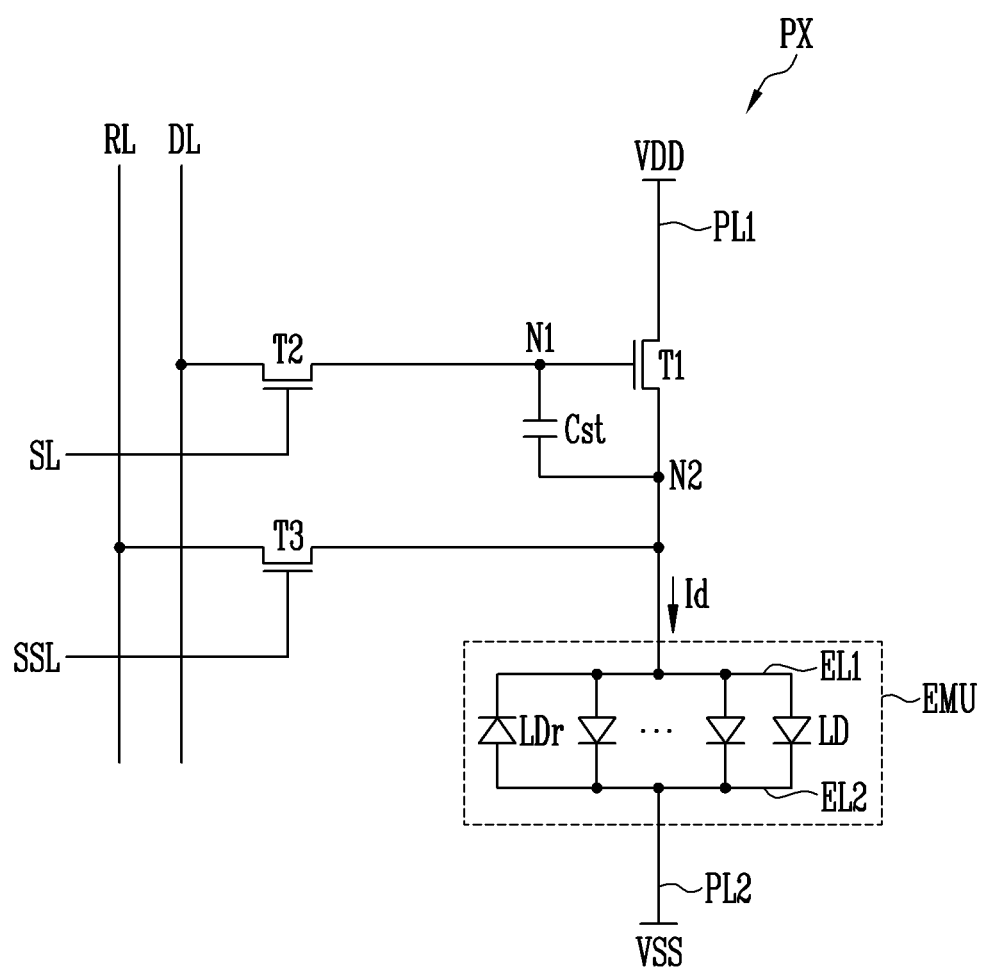
FIG. 12 is a circuit diagram schematically illustrating an electrical connection relationship between components included in a pixel of a display device according to an embodiment.
Figure 13:
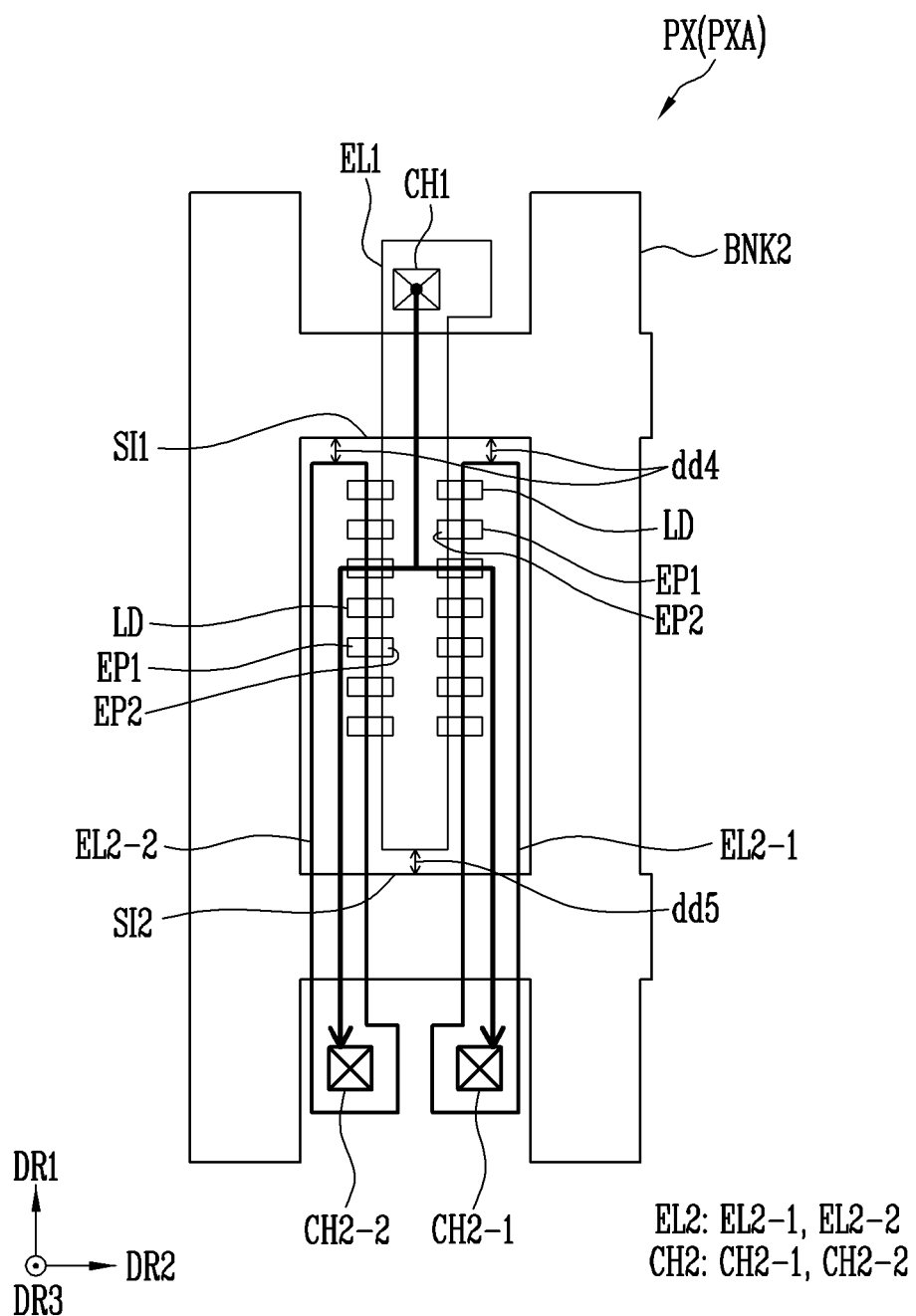
FIG. 13 is a plan view schematically illustrating an example of a current path in a pixel shown in FIG. 12.

FIG. 12 is a circuit diagram schematically illustrating an electrical connection relationship between components included in a pixel of a display device according to an embodiment, and FIG. 13 is a plan view schematically illustrating an example of a current path in one pixel shown in FIG. 12.

Referring to FIG. 12, the pixel PX may include a first transistor T1, a second transistor T2, a third transistor T3, a storage capacitor Cst, and a light-emitting unit EMU. A pixel PX shown in FIG. 12 may be similar to the pixel PX described in FIG. 5, and will be described below based on the differences therebetween.

The light-emitting unit EMU may include light-emitting elements LD connected in parallel between a first power line PL1 to which the first driving voltage VDD may be applied and a second power line PL2 to which the second driving voltage VSS may be applied.

Specifically, the light-emitting unit EMU may include light-emitting elements LD connected in parallel between the first pixel electrode EL1 connected to the second node N2 and the second pixel electrode EL2 connected to the second power line PL2. Here, the first pixel electrode EL1 may be an anode, and the second pixel electrode EL2 may be a cathode. According to an embodiment, the first pixel electrode EL1 may be a cathode, and the second pixel electrode EL2 may be an anode.

The light-emitting unit EMU may generate light of a luminance in response to a driving current Id supplied from the first transistor T1. For example, during one frame period, the first transistor T1 may supply the driving current Id corresponding to a grayscale value of the corresponding frame data to the light-emitting unit EMU. The driving current Id supplied to the light-emitting unit EMU may be divided and flowed through the light-emitting elements LD.

Accordingly, while each light-emitting element LD emits light with a luminance corresponding to the current flowing therethrough, the light-emitting unit EMU may emit light having a luminance corresponding to the driving current Id.

An embodiment in which both ends of the light-emitting elements LD may be connected in the same direction between the first power line PL1 and the second power line PL2 is shown, but the disclosure is not limited thereto. According to an embodiment, the light-emitting unit EMU may further include at least one non-effective light source, for example, a reverse light-emitting element LDr, in addition to the light-emitting elements LD constituting each effective light source. The reverse light-emitting element LDr may be connected in parallel between the first pixel electrode EL1 and the second pixel electrode EL2 together with the light-emitting elements LD constituting effective light sources, and may be connected between the first pixel electrode EL1 and the second pixel electrode EL2 in a direction opposite to the light-emitting elements LD. The reverse light-emitting element LDr may maintain an inactive state even if a driving voltage (e.g., a forward driving voltage) may be applied between the first pixel electrode EL1 and the second pixel electrode EL2, and thus no current substantially flows through the reverse light-emitting element LDr.

Referring to FIG. 13, a pixel PX of the display device according to an embodiment may include a bank BNK2, a first pixel electrode EL1, and a second pixel electrode EL2 stacked on the base layer BSL (refer to FIG. 4). The pixel area PXA of the pixel PX shown in FIG. 13 may correspond to some of the pixel areas PXA of one pixel PX.

The bank BNK2 may be a structure defining (or partitioning) the pixel area PXA or the light-emitting area of each of the corresponding pixel PX and the pixel PX adjacent thereto, and may be, for example, a pixel definition layer.

The bank BNK2 may overlap at least a portion of the first pixel electrode EL1 and the second pixel electrode EL2, which will be described later, and may be disposed around the light-emitting area to surround the light-emitting area in which the light-emitting elements LD may be disposed. The bank BNK2 may be disposed at one side SI1 of the light-emitting area in the second direction DR2, and may be disposed on the other side SI2 of the light-emitting area that may be disposed to face a side SI1 of the light-emitting area in the first direction DR1 with the light-emitting area interposed therebetween.

The bank BNK2 may be configured to include at least one light blocking material and/or a reflective material, thereby preventing light leakage defects that light leaks between the corresponding pixel PX and adjacent pixels PX.

The first pixel electrode EL1 and the second pixel electrode EL2 may extend in the first direction DR1. The second pixel electrode EL2 may include a 2-1-th sub-pixel electrode EL2-1 and a 2-2-th sub-pixel electrode EL2-2 extending in parallel in the first direction DR1. The first pixel electrode EL1 may be disposed between the 2-1-th sub-pixel electrode EL2-1 and the 2-2-th sub-pixel electrode EL2-2, and the first pixel electrode EL1 and two second pixel electrode EL2 may be disposed apart from each other. The first pixel electrode EL1 and the second pixel electrode EL2 may have a bar shape, but the disclosure is not limited thereto. Here, the first pixel electrode EL1 may be an anode, and the second pixel electrode EL2 may be a cathode.

A side of the first pixel electrode EL1 may be physically and/or electrically connected to the first electrode TE1 (refer to FIG. 8) of the first transistor T1 (see FIG. 8) of the pixel circuit layer PCL (refer to FIG. 8) through the first contact hole CH1. A side of the second pixel electrode EL2 may be physically and/or electrically connected to the driving voltage line DVL (refer to FIG. 8) of the pixel circuit layer PCL through the second contact hole CH2. For example, one side of the 2-1-th sub-pixel electrode EL2-1 may be physically and/or electrically connected to the driving voltage line DVL through the 2-1-th contact hole CH2-1, and one side of the 2-2-th sub-pixel electrode EL2-2 may be physically and/or electrically connected to the driving voltage line DVL through the 2-2-th contact hole CH2-2. Accordingly, the first driving voltage VDD may be applied to the first pixel electrode EL1, and the second driving voltage VSS may be applied to the second pixel electrode EL2. For example, the same second driving voltage VSS may be applied to the 2-1-th sub-pixel electrode EL2-1 and the 2-2-th sub-pixel electrode EL2-2.

The first pixel electrode EL1 and the second pixel electrode EL2 may be disposed to partially overlap the bank BNK2 beyond the light-emitting area of the pixel PX.

In an embodiment, a side of the first pixel electrode EL1 may be disposed to partially overlap the bank BNK2 disposed at the side SI1 of the light-emitting area in the second direction DR2. The other side of the first pixel electrode EL1 may be disposed to be spaced apart from the bank BNK2 disposed at the other side SI2 of the light-emitting area in the second direction DR2.

A side of the second pixel electrode EL2 may be disposed to partially overlap the bank BNK2 disposed at the other side SI2 of the light-emitting area in the second direction DR2. The other side of the second pixel electrode EL2 may be disposed to be spaced apart from the bank BNK2 disposed at the one side SI1 of the light-emitting area in the second direction DR2. The 2-1-th sub-pixel electrode EL2-1 and the 2-2-th sub-pixel electrode EL2-2 may be disposed to be spaced apart from each other in the second direction DR2 at a portion overlapping the bank BNK2. Since the same voltage may be applied to the 2-1-th sub-pixel electrode EL2-1 and the 2-2-th sub-pixel electrode EL2-2, it may be possible to minimize short-circuit defects due to the residue of the electrode that may occur a step difference of the second pixel electrode EL2 at a portion overlapping the bank BNK2. Specifically, it may be possible to minimize short-circuit defects that may occur due to residues of electrodes remaining at the other side SI2 of the bank BNK2 in forming the electrodes.

The first pixel electrode EL1 may at least partially overlap the second end EP2 of the light-emitting element LD. The second pixel electrode EL2 may at least partially overlap the first end EP1 of the light-emitting element LD. Accordingly, the first pixel electrode EL1 may be electrically connected to the second end EP2 of the light-emitting element LD, and the second pixel electrode EL2 may be electrically connected to the first end EP1 of the light-emitting element LD.

Looking at the flow of the driving current applied to the light-emitting element LD, the first driving voltage VDD may be applied to the first pixel electrode EL1 through the first contact hole CH1, and the second driving voltage VSS may be applied to the 2-1-th sub-pixel electrode EL2-1 and the 2-2-th sub-pixel electrode EL2-2 through the 2-1-th contact hole CH2-1 and the 2-2-th contact hole CH2-2, respectively. In an embodiment, the first driving voltage VDD may be higher than the second driving voltage VSS. Accordingly, a driving current due to a voltage difference between the first driving voltage VDD and the second driving voltage VSS may flow from the first pixel electrode EL1 to the second pixel electrode EL2.

A driving current may flow through the second end EP2 of the first light-emitting element LD1 overlapping (or in contact with) the first pixel electrode EL1. A driving current may flow through the second pixel electrode EL2 overlapping (or in contact with) the first end EP1 of the light-emitting element LD.

In an embodiment, an end of the other side of the first pixel electrode EL1 may be disposed to be spaced apart from the bank BNK2 disposed at the other side SI2 of the light-emitting area. For example, a distance dd5 between the end of the other side of the first pixel electrode EL1 and the bank BNK2 disposed at the other side SI2 of the light-emitting area may be at least 3 µm. The end at the other side of the second pixel electrode EL2 may be disposed to be spaced apart from the bank BNK2 disposed on at one side SI1 of the light-emitting area. For example, a distance dd4 between the end of the other side of the second pixel electrode EL2 and the bank BNK2 disposed on at one side SI1 of the light-emitting area may be at least 3 µm.

Accordingly, in an embodiment, since the first pixel electrode EL1 and the second pixel electrode EL2 may be disposed to be spaced apart from each other, it may be possible to minimize short-circuit defects that may occur due to the residue of the first pixel electrode EL1 and/or the second pixel electrode EL2 remaining in the bank BNK2 in forming the first pixel electrode EL1 and/or the second pixel electrode EL2, even if different voltages may be applied to the first pixel electrode EL1 and the second pixel electrode EL2. Specifically, it may be possible to minimize short-circuit defects that may occur due to residues of electrodes remaining at one side SI1 of the bank BNK2 in forming the electrodes.

While the disclosure has been shown and described with reference to certain embodiments thereof, it will be understood by those skilled in the art that various changes in forms and details may be made therein without departing from the spirit and scope of the disclosure.

What is claimed is:

1. A display device comprising:
   a base layer;
   a first pixel electrode disposed in a first direction on the base layer and to which a first driving voltage is applied;
   a second pixel electrode disposed in the first direction on the base layer and to which a second driving voltage is applied;
   a first light-emitting element electrically connected to the first pixel electrode and the second pixel electrode;
   a second light-emitting element electrically connected to the first pixel electrode and the second pixel electrode;
   a connection electrode electrically connecting the first pixel electrode and the first light-emitting element, and electrically connecting the second light-emitting element and the second pixel electrode; and
   a bank overlapping at least a portion of the first pixel electrode and at least a portion of the second pixel electrode, the bank surrounding a light-emitting area in which the first light-emitting element and the second light-emitting element are disposed,
   wherein a portion of the connection electrode overlaps the bank.

2. The display device of claim 1, wherein at least a portion of the first pixel electrode and at least a portion of the second pixel electrode overlap the bank disposed at a side of the light-emitting area in a second direction perpendicular to the first direction in a plan view.

3. The display device of claim 2, wherein the first pixel electrode and the second pixel electrode are spaced apart from each other in the second direction in a portion overlapping the bank.

4. The display device of claim 3, wherein the first pixel electrode and the second pixel electrode are disposed apart from each other by at least 7 μm in the portion overlapping the bank.

5. The display device of claim 2, wherein
the connection electrode includes:
  a first vertical portion extending in the first direction;
  a second vertical portion extending in the first direction; and
  a horizontal portion extending in the second direction, and
the horizontal portion overlaps the bank disposed at another side of the light-emitting area in the second direction in a plan view.

6. The display device of claim 5, wherein
a first end of the first light-emitting element is electrically connected to the first vertical portion of the connection electrode, and
a second end of the first light-emitting element is electrically connected to the first pixel electrode.

7. The display device of claim 6, wherein
a first end of the second light-emitting element is electrically connected to the second pixel electrode, and
a second end of the second light-emitting element is electrically connected to the second vertical portion of the connection electrode.

8. The display device of claim 5, wherein an end of the first vertical portion and an end of the second vertical portion are spaced apart from the bank in the light-emitting area.

9. The display device of claim 8, wherein the end of the first vertical portion and the end of the second vertical portion are spaced apart from the bank by at least 3 μm.

10. The display device of claim 1, wherein an end of the first pixel electrode and an end of the second pixel electrode are spaced apart from the bank in the light-emitting area.

11. The display device of claim 10, wherein the end of the first pixel electrode and the end of the second pixel electrode are spaced apart from the bank by at least 3 μm.

12. A display device comprising:
a base layer;
a first pixel electrode disposed in a first direction on the base layer and to which a first driving voltage is applied;
a second pixel electrode disposed in the first direction on the base layer and to which a second driving voltage is applied;
a first light-emitting element electrically connected to the first pixel electrode and the second pixel electrode;
a second light-emitting element electrically connected to the first pixel electrode and the second pixel electrode;
a connection electrode electrically connecting the first pixel electrode and the first light-emitting element, and electrically connecting the second light-emitting element and the second pixel electrode; and
a bank overlapping at least a portion of the first pixel electrode and at least a portion of the second pixel electrode, the bank surrounding a light-emitting area in which the first light-emitting element and the second light-emitting element are disposed, wherein
at least a portion of the first pixel electrode overlaps the bank disposed at a side of the light-emitting area in a second direction perpendicular to the first direction in a plan view, and
at least a portion of the second pixel electrode overlaps the bank disposed at another side of the light-emitting area in the second direction in a plan view,
an end of the first pixel electrode is spaced by at least 3 μm apart from the bank disposed at the another side of the light-emitting area in the light-emitting area, and
a portion of the connection electrode overlaps the bank.

13. The display device of claim 12, wherein
the second pixel electrode includes a first sub-pixel electrode and a second sub-pixel electrode, and
the first sub-pixel electrode and the second sub-pixel electrode of the second pixel electrode are spaced apart from each other in the second direction in a portion overlapping the bank.

14. The display device of claim 12, wherein
a first end of the light-emitting element is electrically connected to the second pixel electrode, and
a second end of the light-emitting element is electrically connected to the first pixel electrode.

15. A display device comprising:
a base layer;
a first pixel electrode disposed in a first direction on the base layer and to which a first driving voltage is applied;
a second pixel electrode disposed in the first direction on the base layer and to which a second driving voltage is applied;
a first light-emitting element electrically connected to the first pixel electrode and the second pixel electrode;
a second light-emitting element electrically connected to the first pixel electrode and the second pixel electrode;
a connection electrode electrically connecting the first pixel electrode and the first light-emitting element, and electrically connecting the second light-emitting element and the second pixel electrode; and
a bank overlapping at least a portion of the first pixel electrode and at least a portion of the second pixel electrode, the bank surrounding a light-emitting area in which the first light-emitting element and the second light-emitting element are disposed, wherein
at least a portion of the first pixel electrode overlaps the bank disposed at a side of the light-emitting area in a second direction perpendicular to the first direction in a plan view,
at least a portion of the second pixel electrode overlaps the bank disposed at another side of the light-emitting area in the second direction in a plan view,
an end of the second pixel electrode is spaced by at least 3 μm apart from the bank disposed at the side of the light-emitting area in the light-emitting area, and
a portion of the connection electrode overlaps the bank.

16. The display device of claim 15, wherein an end of the first pixel electrode is spaced by at least 3 μm apart from the bank disposed at the another side of the light-emitting area in the light-emitting area.

* * * * *